(12) United States Patent
Lee

(10) Patent No.: US 10,211,818 B2
(45) Date of Patent: Feb. 19, 2019

(54) INTERPOLATOR

(71) Applicant: VIA Alliance Semiconductor Co., Ltd., Shanghai (CN)

(72) Inventor: Yeong-Sheng Lee, Fremont, CA (US)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 5 days.

(21) Appl. No.: 15/406,837

(22) Filed: Jan. 16, 2017

(65) Prior Publication Data

US 2018/0013411 A1 Jan. 11, 2018

Related U.S. Application Data

(63) Continuation-in-part of application No. 15/243,287, filed on Aug. 22, 2016, now Pat. No. 9,628,091, and
(Continued)

(51) Int. Cl.
| | |
|---|---|
| *H03K 5/00* | (2006.01) |
| *H03D 13/00* | (2006.01) |
| *H03K 5/134* | (2014.01) |
| *H03K 17/687* | (2006.01) |
| *H03K 19/20* | (2006.01) |

(Continued)

(52) U.S. Cl.
CPC .......... *H03K 5/134* (2014.07); *H03D 13/003* (2013.01); *H03K 17/6872* (2013.01); *H03K 19/20* (2013.01); *H03L 7/085* (2013.01); *H03L 7/087* (2013.01); *H03K 2005/00039* (2013.01); *H03K 2005/00052* (2013.01); *H03K 2005/00078* (2013.01); *H04L 7/033* (2013.01)

(58) Field of Classification Search
CPC .............. H03K 5/134; H03K 17/6872; H03K 2005/00039; H03D 13/1003; H03D 13/004; H03L 7/085; H03L 7/087
USPC ....................................................... 327/251
See application file for complete search history.

(56) References Cited

U.S. PATENT DOCUMENTS

| 8,471,617 B2 | 6/2013 | Choi | |
|---|---|---|---|
| 2005/0007168 A1* | 1/2005 | Park ..................... | H03K 5/1565 327/175 |

(Continued)

FOREIGN PATENT DOCUMENTS

WO   WO 2007/146590 A2   12/2007

OTHER PUBLICATIONS

European Search Report dated May 23, 2017, issued in application No. 16200684.5-1809.
(Continued)

*Primary Examiner* — Patrick C Chen
(74) *Attorney, Agent, or Firm* — McClure, Qualey & Rodack, LLP

(57) ABSTRACT

An interpolator includes a first delay circuit, a second delay circuit, and a tunable delay circuit. The first delay circuit delays a first input signal for a fixed delay time, so as to generate a first output signal. The second delay circuit delays a second input signal for the fixed delay time, so as to generate a second output signal. The tunable delay circuit delays the first input signal for a tunable delay time, so as to generate an output interpolation signal. The tunable delay time is determined according to the first output signal, the second output signal, and the output interpolation signal.

14 Claims, 12 Drawing Sheets

Related U.S. Application Data a continuation-in-part of application No. 15/203,392, filed on Jul. 6, 2016.

(51) Int. Cl.
*H03L 7/085* (2006.01)
*H03L 7/087* (2006.01)
*H04L 7/033* (2006.01)

(56) References Cited

U.S. PATENT DOCUMENTS

| | | |
|---|---|---|
| 2007/0080728 A1 | 4/2007 | Iwata |
| 2008/0101524 A1 | 5/2008 | Jeong et al. |
| 2009/0058483 A1 | 3/2009 | Shin et al. |
| 2010/0117702 A1 | 5/2010 | Jang et al. |

OTHER PUBLICATIONS

European Search Report dated May 29, 2017, issued in application No. 16199007.2-1810.

Yeo, K.S., et al.; "Non-sequential linear CMOS phase detector for CDR applications;" IEE Proceedings—Circuits Devices and Systems; vol. 152; No. 6; Dec. 2005; pp. 667-672.

Moon, Y., et al.; "An all-analog multiphase delay-locked loop using a replica delay line for wide-range operation and low-jitter performance;" IEEE Journal of Solid-State Circuits; vol. 35; No. 3; Mar. 2000; pp. 377-384.

\* cited by examiner

INTERPOLATOR

CROSS REFERENCE TO RELATED APPLICATIONS

This application is a Continuation-In-Part of application Ser. No. 15/203,392, filed Jul. 6, 2016, the entirety of which is incorporated by reference herein. Also, this application is a Continuation-In-Part of application Ser. No. 15/243,287, filed Aug. 22, 2016, the entirety of which is incorporated by reference herein.

BACKGROUND OF THE INVENTION

Field of the Invention

The disclosure generally relates to an interpolator, and more specifically, to a highly-accurate phase interpolator.

Description of the Related Art

In the field of electric circuits, interpolators are common and used in many applications to generate multi-phase signals. For example, a phase interpolator is a critical circuit in the receiver of a serial link, and it allows the receiver to adjust the phase of its sampling clocks. However, conventional interpolators often have the problem of non-linearity and high sensitivity to process variations. Accordingly, there is a need to propose a novel design for solving the problem of the prior art.

BRIEF SUMMARY OF THE INVENTION

In a preferred embodiment, the invention is directed to an interpolator, including: a first delay circuit, delaying a first input signal for a fixed delay time, so as to generate a first output signal; a second delay circuit, delaying a second input signal for the fixed delay time, so as to generate a second output signal; and a tunable delay circuit, delaying the first input signal for a tunable delay time, so as to generate an output interpolation signal, wherein the tunable delay time is determined according to the first output signal, the second output signal, and the output interpolation signal, wherein the first output signal, the second output signal, and the output interpolation signal have the same frequency, and a phase of the first output signal leads a phase of the second output signal, and a phase of the output interpolation signal is substantially between the phase of the first output signal and the phase of the second output signal.

In some embodiments, the phase of the output interpolation signal is substantially in the middle of the phase of the first output signal and the phase of the second output signal.

In some embodiments, each of the first delay circuit and the second delay circuit is formed by cascading two fixed inverters.

In some embodiments, the tunable delay circuit includes a tunable unit which is formed by cascading a tunable inverter and a fixed inverter, wherein the tunable inverter is controlled by the first output signal, the second output signal, and the output interpolation signal.

In some embodiments, the tunable unit has an input node and an output node, and includes: a first P-type transistor, wherein the first P-type transistor has a control terminal, a first terminal coupled to a supply voltage, and a second terminal coupled to a first node; a second P-type transistor, wherein the second P-type transistor has a control terminal, a first terminal coupled to the first node, and a second terminal coupled to a second node; a first N-type transistor, wherein the first N-type transistor has a control terminal, a first terminal coupled to a third node, and a second terminal coupled to the second node; a second N-type transistor, wherein the second N-type transistor has a control terminal, a first terminal coupled to a ground voltage, and a second terminal coupled to the third node; and an inverter, wherein the inverter has an input terminal coupled to the second node, and an output terminal coupled to the output node; wherein the control terminal of one of the first P-type transistor and the second P-type transistor is coupled to the input node, and the control terminal of the other one of the first P-type transistor and the second P-type transistor is coupled to a first control signal, wherein the control terminal of one of the first N-type transistor and the second N-type transistor is coupled to the input node, and the control terminal of the other one of the first N-type transistor and the second N-type transistor is coupled to a second control signal, wherein the first control signal and the second control signal are generated according to the first output signal, the second output signal, and the output interpolation signal, wherein the input node of the tunable unit is arranged for receiving the first input signal, and the output node of the tunable unit is arranged for outputting the output interpolation signal.

In some embodiments, the tunable unit further includes a first control circuit which includes: a third P-type transistor, wherein the third P-type transistor has a control terminal coupled to a fourth node, a first terminal coupled to the supply voltage, and a second terminal coupled to the fourth node; a first current sink, drawing a first current from the fourth node; a fourth P-type transistor, wherein the fourth P-type transistor has a control terminal coupled to the fourth node, a first terminal coupled to the supply voltage, and a second terminal coupled to a fifth node; a first NAND gate, wherein the first NAND gate has a first input terminal for receiving an inverse of a second feedback signal, a second input terminal for receiving a third feedback signal, and an output terminal for outputting a second tuning signal at a sixth node; a fifth P-type transistor, wherein the fifth P-type transistor has a control terminal coupled to the sixth node, a first terminal coupled to the fifth node, and a second terminal coupled to a first control node; a third N-type transistor, wherein the third N-type transistor has a control terminal coupled to a seventh node, a first terminal coupled to the ground voltage, and a second terminal coupled to the seventh node; a first current source, supplying a second current to the seventh node; a fourth N-type transistor, wherein the fourth N-type transistor has a control terminal coupled to the seventh node, a first terminal coupled to the ground voltage, and a second terminal coupled to an eighth node; a first AND gate, wherein the first AND gate has a first input terminal for receiving an inverse of a first feedback signal, a second input terminal for receiving the second feedback signal, and an output terminal for outputting a first tuning signal at a ninth node; and a fifth N-type transistor, wherein the fifth N-type transistor has a control terminal coupled to the ninth node, a first terminal coupled to the eighth node, and a second terminal coupled to the first control node; wherein the first control node is arranged for outputting the first control signal, the first feedback signal is the first output signal, the second feedback signal is the output interpolation signal, and the third feedback signal is the second output signal.

In some embodiments, the first control circuit further includes: a first capacitor, coupled between the first control node and the ground voltage; and a first switch element, coupled between the first control node and the ground voltage, wherein the first switch element is initially closed and then kept open so as to fine-tine a voltage level of the first control signal.

In some embodiments, the tunable unit further includes a second control circuit which includes: a sixth P-type transistor, wherein the sixth P-type transistor has a control terminal coupled to a tenth node, a first terminal coupled to the supply voltage, and a second terminal coupled to the tenth node; a second current sink, drawing a third current from the tenth node; a seventh P-type transistor, wherein the seventh P-type transistor has a control terminal coupled to the tenth node, a first terminal coupled to the supply voltage, and a second terminal coupled to an eleventh node; a second NAND gate, wherein the second NAND gate has a first input terminal for receiving a first feedback signal, a second input terminal for receiving an inverse of a second feedback signal, and an output terminal for outputting a third tuning signal at a twelfth node; an eighth P-type transistor, wherein the eighth P-type transistor has a control terminal coupled to the twelfth node, a first terminal coupled to the eleventh node, and a second terminal coupled to a second control node; a sixth N-type transistor, wherein the sixth N-type transistor has a control terminal coupled to a thirteenth node, a first terminal coupled to the ground voltage, and a second terminal coupled to the thirteenth node; a second current source, supplying a fourth current to the thirteenth node; a seventh N-type transistor, wherein the seventh N-type transistor has a control terminal coupled to the thirteenth node, a first terminal coupled to the ground voltage, and a second terminal coupled to a fourteenth node; a second AND gate, wherein the second AND gate has a first input terminal for receiving the second feedback signal, a second input terminal for receiving an inverse of a third feedback signal, and an output terminal for outputting a fourth tuning signal at a fifteenth node; and an eighth N-type transistor, wherein the eighth N-type transistor has a control terminal coupled to the fifteenth node, a first terminal coupled to the fourteenth node, and a second terminal coupled to the second control node; wherein the second control node is arranged for outputting the second control signal, the first feedback signal is the first output signal, the second feedback signal is the output interpolation signal, and the third feedback signal is the second output signal.

In some embodiments, the second control circuit further includes: a second capacitor, coupled between the second control node and the ground voltage; and a second switch element, coupled between the supply voltage and the second control node, wherein the second switch element is initially closed and then kept open so as to fine-tine a voltage level of the second control signal.

In some embodiments, the tunable delay circuit further generates a plurality of output interpolation signals that have the same frequency and have different corresponding phases that are substantially between the phase of the first output signal and the phase of the second output signal, wherein the tunable delay circuit includes a plurality of tunable units, each of which is formed by cascading a tunable inverter and a fixed inverter, and each of which generates a corresponding one of the plurality of output interpolation signals according to the first output signal, the second output signal, and the corresponding one of the plurality of output interpolation signals.

In some embodiments, each of the plurality of tunable units has an input node and an output node, and includes: a first P-type transistor, wherein the first P-type transistor has a control terminal, a first terminal coupled to a supply voltage, and a second terminal coupled to a first node; a second P-type transistor, wherein the second P-type transistor has a control terminal, a first terminal coupled to the first node, and a second terminal coupled to a second node; a first N-type transistor, wherein the first N-type transistor has a control terminal, a first terminal coupled to a third node, and a second terminal coupled to the second node; a second N-type transistor, wherein the second N-type transistor has a control terminal, a first terminal coupled to a ground voltage, and a second terminal coupled to the third node; and an inverter, wherein the inverter has an input terminal coupled to the second node, and an output terminal coupled to the output node; wherein the control terminal of one of the first P-type transistor and the second P-type transistor is coupled to the input node, and the control terminal of the other one of the first P-type transistor and the second P-type transistor is coupled to a first control signal, wherein the control terminal of one of the first N-type transistor and the second N-type transistor is coupled to the input node, and the control terminal of the other one of the first N-type transistor and the second N-type transistor is coupled to a second control signal, wherein the input node of each of the plurality of tunable units is arranged for receiving the first input signal; wherein the output node of each of the plurality of tunable units is arranged for outputting the corresponding one of the plurality of output interpolation signals; wherein for each of the plurality of tunable units, the first control signal and the second control signal are generated according to the first output signal, the second output signal, and the corresponding one of the plurality of output interpolation signals.

In some embodiments, each of the plurality of tunable units further includes a first control circuit which includes: a third P-type transistor, wherein the third P-type transistor has a control terminal coupled to a fourth node, a first terminal coupled to the supply voltage, and a second terminal coupled to the fourth node; a first current sink, drawing a first current from the fourth node; a fourth P-type transistor, wherein the fourth P-type transistor has a control terminal coupled to the fourth node, a first terminal coupled to the supply voltage, and a second terminal coupled to a fifth node; a first NAND gate, wherein the first NAND gate has a first input terminal for receiving an inverse of a second feedback signal, a second input terminal for receiving a third feedback signal, and an output terminal for outputting a second tuning signal at a sixth node; a fifth P-type transistor, wherein the fifth P-type transistor has a control terminal coupled to the sixth node, a first terminal coupled to the fifth node, and a second terminal coupled to a first control node, and wherein the first control node is arranged for outputting the first control signal; a third N-type transistor, wherein the third N-type transistor has a control terminal coupled to a seventh node, a first terminal coupled to the ground voltage, and a second terminal coupled to the seventh node; a first current source, supplying a second current to the seventh node; a fourth N-type transistor, wherein the fourth N-type transistor has a control terminal coupled to the seventh node, a first terminal coupled to the ground voltage, and a second terminal coupled to an eighth node; a first AND gate, wherein the first AND gate has a first input terminal for receiving an inverse of a first feedback signal, a second input terminal for receiving the second feedback signal, and an output terminal for outputting a first tuning signal at a ninth node; a fifth N-type transistor, wherein the fifth N-type transistor has a control terminal coupled to the ninth node, a first terminal coupled to the eighth node, and a second terminal coupled to the first control node; a first capacitor, coupled between the first control node and the ground voltage; and a first switch element, coupled between the first control node and the ground voltage, wherein the first switch element is initially closed and then kept open so as to fine-tine a voltage level of the first control signal; wherein the first feedback signal is the first output signal, the second feedback signal is the corresponding one of the plurality of output interpolation signals, and the third feedback signal is the second output signal.

In some embodiments, for each of the plurality of tunable units, the current ratio of the first current to the second current for the nth tunable unit is (N+1−n)/n, wherein N is the total number of the plurality of tunable units.

In some embodiments, each of the plurality of tunable units further includes a second control circuit which includes: a sixth P-type transistor, wherein the sixth P-type transistor has a control terminal coupled to a tenth node, a first terminal coupled to the supply voltage, and a second terminal coupled to the tenth node; a second current sink, drawing a third current from the tenth node; a seventh P-type transistor, wherein the seventh P-type transistor has a control terminal coupled to the tenth node, a first terminal coupled to the supply voltage, and a second terminal coupled to an eleventh node; a second NAND gate, wherein the second NAND gate has a first input terminal for receiving a first feedback signal, a second input terminal for receiving an inverse of a second feedback signal, and an output terminal for outputting a third tuning signal at a twelfth node; an eighth P-type transistor, wherein the eighth P-type transistor has a control terminal coupled to the twelfth node, a first terminal coupled to the eleventh node, and a second terminal coupled to a second control node, and wherein the second control node is arranged for outputting the second control signal; a sixth N-type transistor, wherein the sixth N-type transistor has a control terminal coupled to a thirteenth node, a first terminal coupled to the ground voltage, and a second terminal coupled to the thirteenth node; a second current source, supplying a fourth current to the thirteenth node; a seventh N-type transistor, wherein the seventh N-type transistor has a control terminal coupled to the thirteenth node, a first terminal coupled to the ground voltage, and a second terminal coupled to a fourteenth node; a second AND gate, wherein the second AND gate has a first input terminal for receiving the second feedback signal, a second input terminal for receiving an inverse of a third feedback signal, and an output terminal for outputting a fourth tuning signal at a fifteenth node; an eighth N-type transistor, wherein the eighth N-type transistor has a control terminal coupled to the fifteenth node, a first terminal coupled to the fourteenth node, and a second terminal coupled to the second control node; a second capacitor, coupled between the second control node and the ground voltage; and a second switch element, coupled between the supply voltage and the second control node, wherein the second switch element is initially closed and then kept open so as to fine-tine a voltage level of the second control signal; wherein the first feedback signal is the first output signal, the second feedback signal is the corresponding one of the plurality of output interpolation signals, and the third feedback signal is the second output signal.

In some embodiments, for each of the plurality of tunable units, the current ratio of the third current to the fourth current for the nth tunable unit is (N+1−n)/n, wherein N is the total number of the plurality of tunable units.

In some embodiments, the tunable delay circuit is a digital control circuit which includes: a delay chain, delaying the first output signal for different delay times, so as to generate a plurality of delay signals; a multiplexer, selecting one of the delay signals as the output interpolation signal according to a number; a counter, incrementing the number according to a control clock; and a decision circuit, generating the control clock according to the first output signal, the second output signal, and the output interpolation signal.

In some embodiments, the decision circuit includes: a first P-type transistor, wherein the first P-type transistor has a control terminal coupled to a first node, a first terminal coupled to a supply voltage, and a second terminal coupled to the first node; a current sink, drawing a first current from the first node; a second P-type transistor, wherein the second P-type transistor has a control terminal coupled to the first node, a first terminal coupled to the supply voltage, and a second terminal coupled to a second node; a first NAND gate, wherein the first NAND gate has a first input terminal for receiving the first output signal, a second input terminal for receiving an inverse of the output interpolation signal, and an output terminal for outputting a first tuning signal at a third node; a third P-type transistor, wherein the third P-type transistor has a control terminal coupled to the third node, a first terminal coupled to the second node, and a second terminal coupled to a first control node; a first N-type transistor, wherein the first N-type transistor has a control terminal coupled to a fourth node, a first terminal coupled to a ground voltage, and a second terminal coupled to the fourth node; a current source, supplying a second current to the fourth node; a second N-type transistor, wherein the second N-type transistor has a control terminal coupled to the fourth node, a first terminal coupled to the ground voltage, and a second terminal coupled to a fifth node; a first AND gate, wherein the first AND gate has a first input terminal for receiving the output interpolation signal, a second input terminal for receiving an inverse of the second output signal, and an output terminal for outputting a second tuning signal at a sixth node; a third N-type transistor, wherein the third N-type transistor has a control terminal coupled to the sixth node, a first terminal coupled to the fifth node, and a second terminal coupled to the first control node; and a capacitor, coupled between the first control node and the ground voltage, wherein the control clock is generated according to a control voltage at the first control node.

In some embodiments, the decision circuit further includes: a second switch element, coupled between the first control node and a reference voltage, wherein the second switch element is selectively closed or opened according to an inverse of the first output signal, and wherein the reference voltage is substantially a half of the supply voltage; a comparator, wherein the comparator has a positive input terminal coupled to the reference voltage, a negative input terminal coupled to the first control node, and an output terminal coupled to a seventh node; a third switch element, coupled between the seventh node and a second control node, wherein the third switch element is selectively closed or opened according to a first switching signal, and wherein the second control node is arranged for outputting the control clock; and a fourth switch element, coupled between the ground voltage and the second control node, wherein the fourth switch element is selectively closed or opened according to a second switching signal, wherein the first switching signal and the second switching signal are generated according to the first output signal and the second output signal.

In some embodiments, the decision circuit further includes: a second AND gate, wherein the second AND gate has a first input terminal for receiving the first output signal, a second input terminal for receiving the second output signal, and an output terminal for outputting the first switching signal; and a second NAND gate, wherein the second NAND gate has a first input terminal for receiving the first output signal, a second input terminal for receiving the second output signal, and an output terminal for outputting the second switching signal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1A:
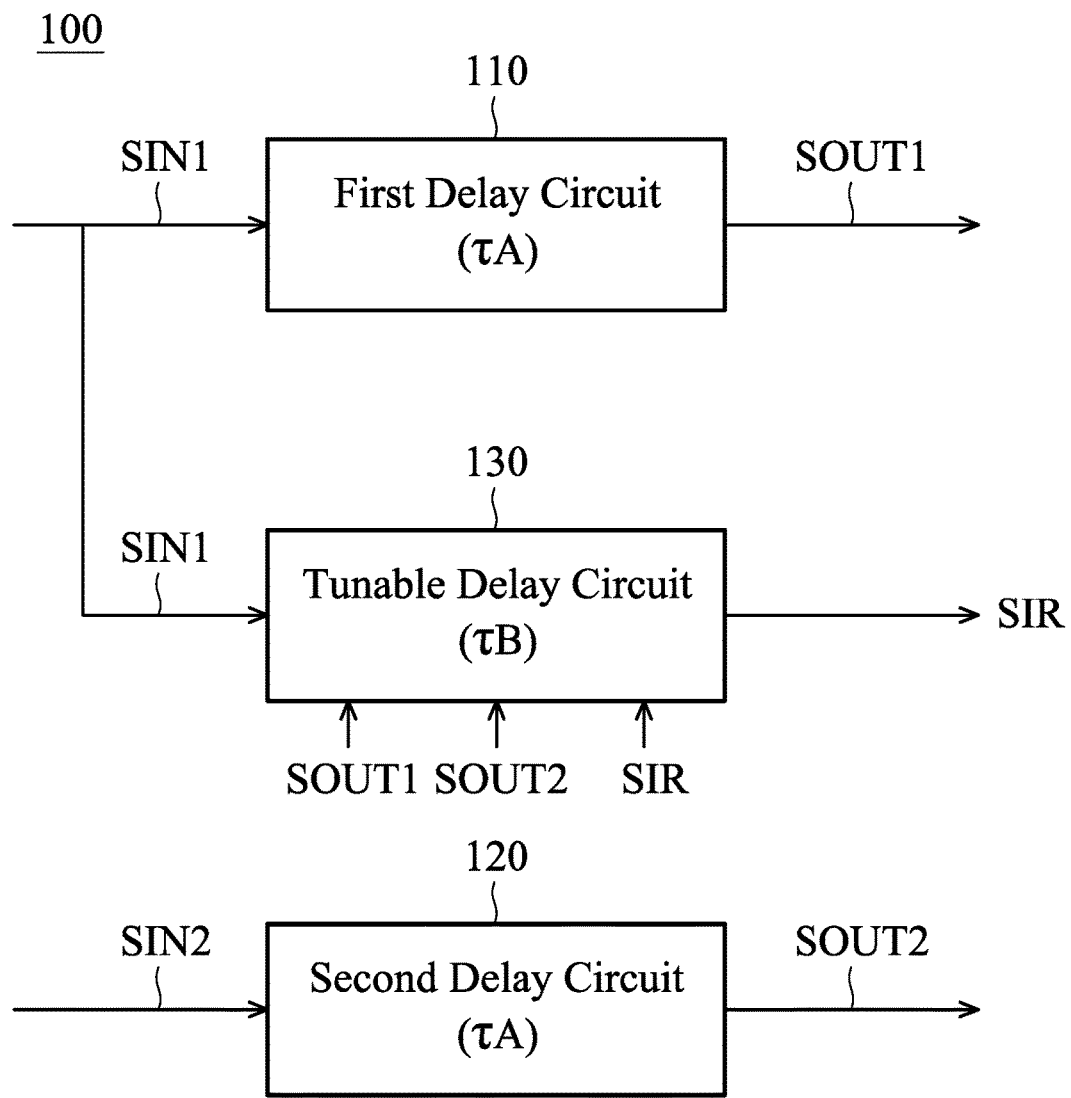
FIG. 1A is a diagram of an interpolator according to an embodiment of the invention.
Figure 1B:
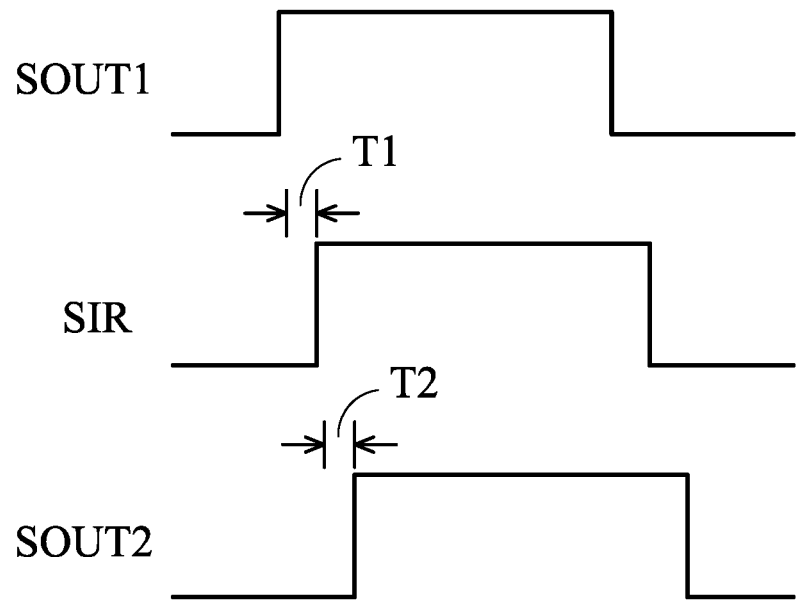
FIG. 1B is a diagram of signal waveforms of an interpolator according to an embodiment of the invention.

FIG. 1A is a diagram of an interpolator 100 according to an embodiment of the invention. As shown in FIG. 1A, the interpolator 100 includes a first delay circuit 110, a second delay circuit 120, and a tunable delay circuit 130. The interpolator 100 is configured to process a first input signal SIN1 and a second input signal SIN2. For example, the first input signal SIN1 and the second input signal SIN2 may be two clock signals which have the same clock frequency. The phase of the first input signal SIN1 may lead the phase of the second input signal SIN2. The first delay circuit 110 delays the first input signal SIN1 for a fixed delay time TA, so as to generate a first output signal SOUT1. The second delay circuit 120 also delays the second input signal SIN2 for the fixed delay time TA, so as to generate a second output signal SOUT2. The tunable delay circuit 130 delays the first input signal SIN1 for a tunable delay time TB, so as to generate an output interpolation signal SIR. FIG. 1B is a diagram of signal waveforms of the interpolator 100 according to an embodiment of the invention. As shown in FIG. 1B, the first output signal SOUT1 and the second output signal SOUT2 have the same clock frequency, but the phase of the first output signal SOUT1 leads the phase of the second output signal SOUT2. The phase of the output interpolation signal SIR may be substantially between the phase of the first output signal SOUT1 and the phase of the second output signal SOUT2. For example, the time interval T1 between the rising edge of the first output signal SOUT1 and the rising edge of the output interpolation signal SIR may be substantially equal to the time interval T2 between the rising edge of the output interpolation signal SIR and the rising edge of the second output signal SOUT2. It should be noted that the tunable delay time TB is adjustable and determined according to the first output signal SOUT1, the second output signal SOUT2, and the output interpolation signal SIR. That is, the phase of the output interpolation signal SIR can be fine-tuned and optimized with a negative feedback mechanism.

The following embodiments describe the circuits and operations of the interpolator 100. It should be understood that the following figures and descriptions are merely exemplary, rather than restricted limitations of the invention.

Figure 2:
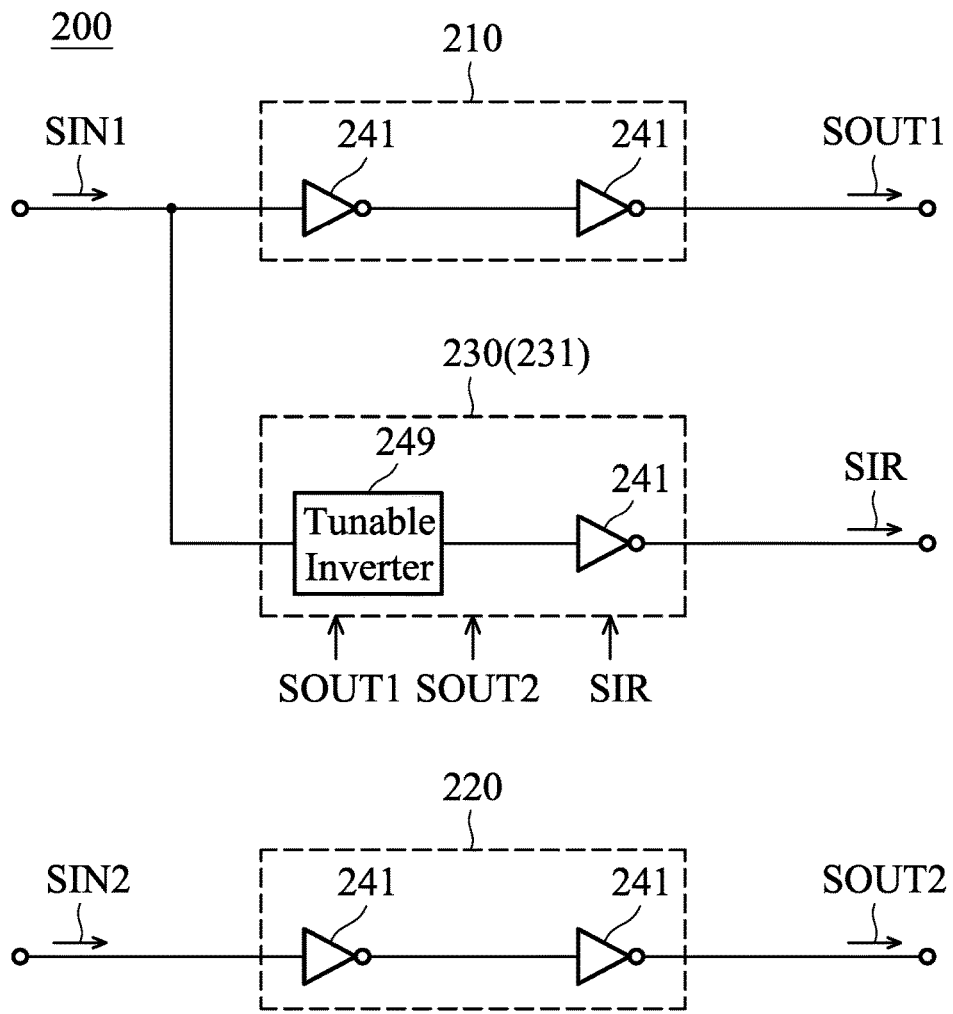
FIG. 2 is a diagram of an interpolator according to an embodiment of the invention.

FIG. 2 is a diagram of an interpolator 200 according to an embodiment of the invention. FIG. 2 is similar to FIG. 1A. In the embodiment of FIG. 2, the interpolator 200 includes a first delay circuit 210, a second delay circuit 220, and a tunable delay circuit 230, and their functions have been described in the embodiment of FIG. 1A. In one embodiment, each of the first delay circuit 210 and the second delay circuit 220 is formed by cascading two fixed inverters 241. The tunable delay circuit 230 includes at least one tunable unit 231. The tunable unit 231 is formed by cascading a tunable inverter 249 and a fixed inverter 241. Each fixed inverter 241 has a fixed delay time. On the other hand, the tunable inverter 249 has a tunable delay time, which is determined according to a negative feedback mechanism of the first output signal SOUT1, the second output signal SOUT2, and the output interpolation signal SIR. In other embodiments, each of the first delay circuit 210 and the second delay circuit 220 may be formed by other numbers of fixed inverters 241.

Figure 3:
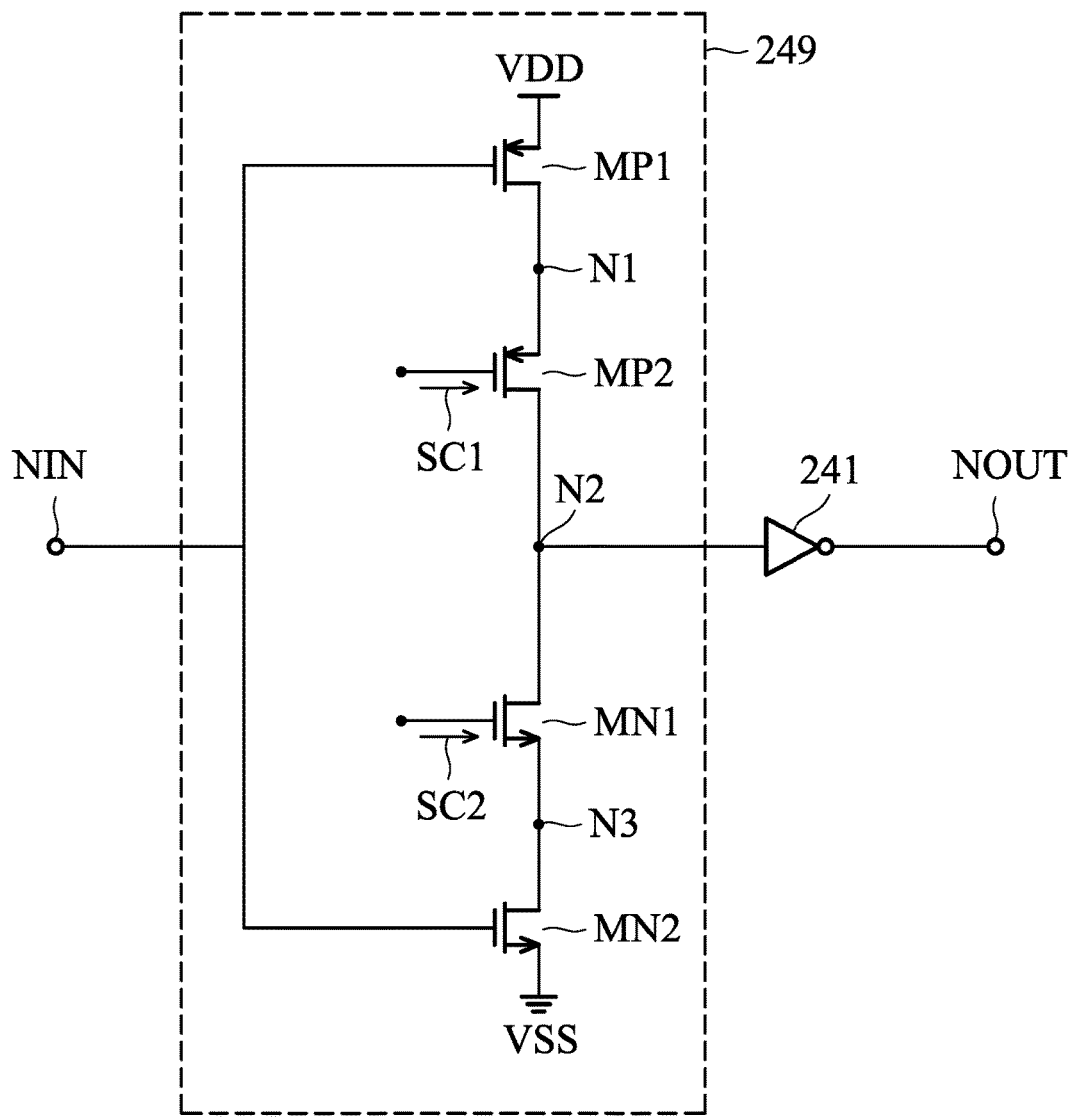
FIG. 3 is a diagram of a tunable unit according to an embodiment of the invention.

FIG. 3 is a diagram of the tunable unit 231 according to an embodiment of the invention. In the embodiment of FIG. 3, the tunable unit 231 has an input node NIN and an output node NOUT, and includes a tunable inverter 249 and an (fixed) inverter 241. The tunable inverter 249 includes a first P-type transistor MP1, a second P-type transistor MP2, a first N-type transistor MN1, and a second N-type transistor MN2. For example, each P-type transistor may be a PMOS transistor (P-type Metal Oxide Semiconductor Field Effect Transistor), and each N-type transistor may be an NMOS transistor (N-type Metal Oxide Semiconductor Field Effect Transistor). The first P-type transistor MP1 has a control terminal coupled to the input node NIN, a first terminal coupled to a supply voltage VDD, and a second terminal coupled to a first node N1. The second P-type transistor MP2 has a control terminal for receiving a first control signal SC1, a first terminal coupled to the first node N1, and a second terminal coupled to a second node N2. The first N-type transistor MN1 has a control terminal for receiving a second control signal SC2, a first terminal coupled to a third node N3, and a second terminal coupled to the second node N2. The second N-type transistor MN2 has a control terminal coupled to the input node NIN, a first terminal coupled to a ground voltage VSS, and a second terminal coupled to the third node N3. The inverter 241 has an input terminal coupled to the second node N2, and an output terminal coupled to the output node NOUT. In the embodiment of FIG. 2 and FIG. 3, the input node NIN of the tunable unit 231 is arranged for receiving the first input signal SIN1, and the output node NOUT of the tunable unit 231 is arranged for outputting the output interpolation signal SIR. The first control signal SC1 and the second control signal SC2 are used to fine-tune the total delay time of the tunable inverter 249, and they are generated according to the first output signal SOUT1, the second output signal SOUT2, and the output interpolation signal SIR. In some embodiments, the tunable unit 231 further includes a first control circuit 232 for generating the first control signal SC1, and a second control circuit 233 for generating the second control signal SC2. Although the embodiment of FIG. 3 shows a configuration of the tunable unit 231 with the input node NIN coupled to control terminals of both the topmost and bottommost transistors, in other embodiments, the tunable unit 231 may have other configurations, such as with the input node NIN coupled to control terminals of transistors other than both the topmost and bottommost. In general, the control terminal of one of the two transistors coupled between the supply voltage VDD and the second node N2 may be coupled to the input node NIN, while the control terminal of the other one of the two transistors coupled between the supply voltage VDD and the second node N2 may be coupled to the first control signal SC1; in general, the control terminal of one of the two transistors coupled between the ground voltage VSS and the second node N2 may be coupled to the input node NIN, while the control terminal of the other one of the two transistors coupled between the ground voltage VSS and the second node N2 may be coupled to the second control signal SC2. The fixed inverters 241 in the above may be implemented by, for example, conventional CMOS (Complementary Metal Oxide Semiconductor) inverters.

Figure 4A:
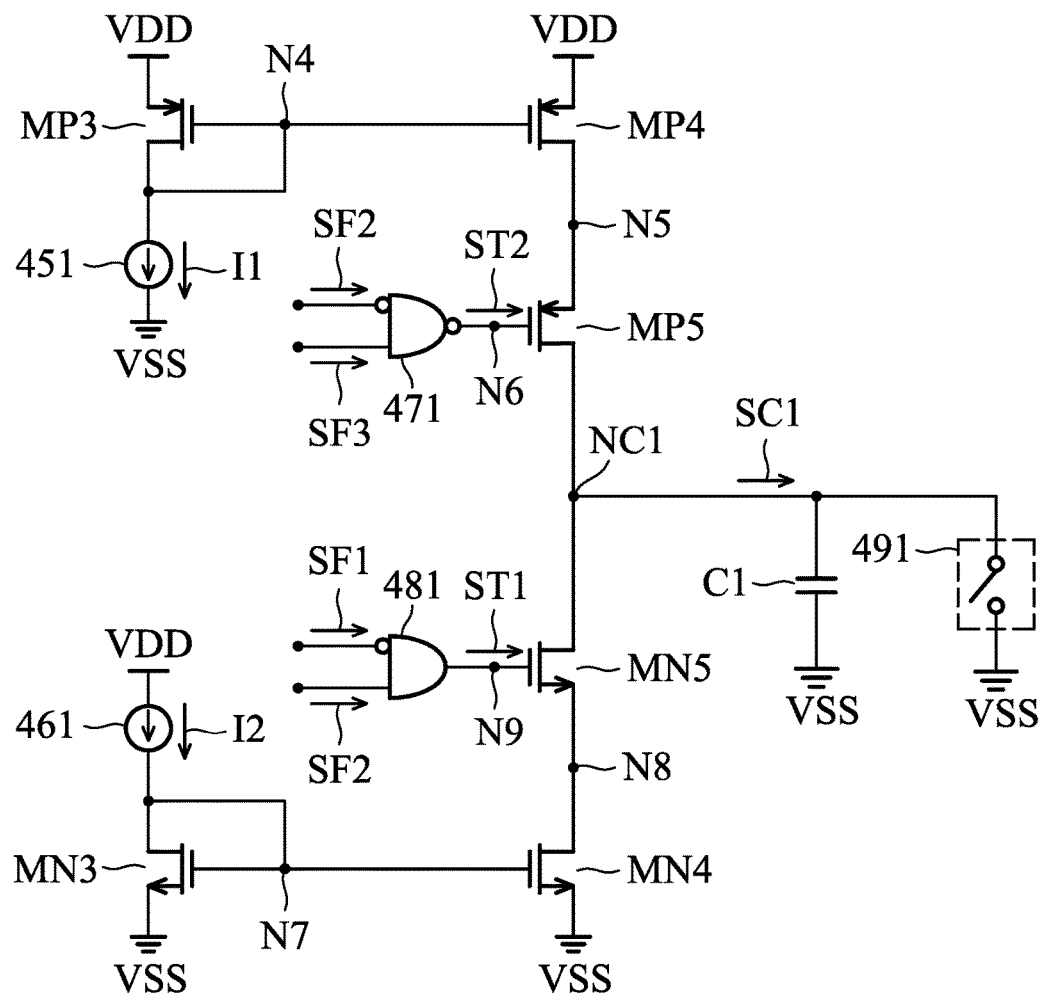
FIG. 4A is a diagram of a first control circuit according to an embodiment of the invention.

FIG. 4A is a diagram of the first control circuit 232 according to an embodiment of the invention. In the embodiment of FIG. 4A, the first control circuit 232 includes a third P-type transistor MP3, a fourth P-type transistor MP4, a fifth P-type transistor MP5, a first current sink 451, a first NAND gate 471, a third N-type transistor MN3, a fourth N-type transistor MN4, a fifth N-type transistor MN5, a first current source 461, a first AND gate 481, a first capacitor C1, and a first switch element 491. For example, each P-type transistor may be a PMOS transistor (P-type Metal Oxide Semiconductor Field Effect Transistor), and each N-type transistor may be an NMOS transistor (N-type Metal Oxide Semiconductor Field Effect Transistor). The third P-type transistor MP3 has a control terminal coupled to a fourth node N4, a first terminal coupled to the supply voltage VDD, and a second terminal coupled to the fourth node N4. The first current sink 451 draws a first current I1 from the fourth node N4. The fourth P-type transistor MP4 has a control terminal coupled to the fourth node N4, a first terminal coupled to the supply voltage VDD, and a second terminal coupled to a fifth node N5. A first current mirror is formed by the third P-type transistor MP3 and the fourth P-type transistor MP4, which substantially have the same transistor sizes so as to mirror the first current I1 from the fourth node N4 to the fifth node N5. The first NAND gate 471 has a first input terminal for receiving the inverse of a second feedback signal SF2, a second input terminal for receiving a third feedback signal SF3, and an output terminal for outputting a second tuning signal ST2 at a sixth node N6. The fifth P-type transistor MP5 has a control terminal coupled to the sixth node N6, a first terminal coupled to the fifth node N5, and a second terminal coupled to a first control node NC1. Third N-type transistor MN3 has a control terminal coupled to a seventh node N7, a first terminal coupled to the ground voltage VSS, and a second terminal coupled to the seventh node N7. The first current source 461 supplies a second current I2 to the seventh node N7. The fourth N-type transistor MN4 has a control terminal coupled to the seventh node N7, a first terminal coupled to the ground voltage VSS, and a second terminal coupled to an eighth node N8. A second current mirror is formed by the third N-type transistor MN3 and the fourth N-type transistor MN4, which substantially have the same transistor sizes so as to mirror the second current I2 from the seventh node N7 to the eighth node N8. The first AND gate 481 has a first input terminal for receiving the inverse of a first feedback signal SF1, a second input terminal for receiving the second feedback signal SF2, and an output terminal for outputting a first tuning signal ST1 at a ninth node N9. The fifth N-type transistor MN5 has a control terminal coupled to the ninth node N9, a first terminal coupled to the eighth node N8, and a second terminal coupled to the first control node NC1. The first control node NC1 is arranged for outputting the first control signal SC1. If the first control circuit 232 is applied to the interpolator 200 of FIG. 2, the second current I2 may be substantially equal to the first current I1, the first feedback signal SF1 may be the first output signal SOUT1, the second feedback signal SF2 may be the output interpolation signal SIR, and the third feedback signal SF3 may be the second output signal SOUT2. The first capacitor C1 is coupled between the first control node NC1 and the ground voltage VSS. The first switch element 491 is coupled between the first control node NC1 and the ground voltage VSS. The first switch element 491 is initially closed (i.e., conducting) so as to discharge the first capacitor C1 to the ground voltage VSS, and then it is opened (i.e., not conducting) and kept open so as to fine-tine the voltage level of the first control signal SC1.

Figure 4B:
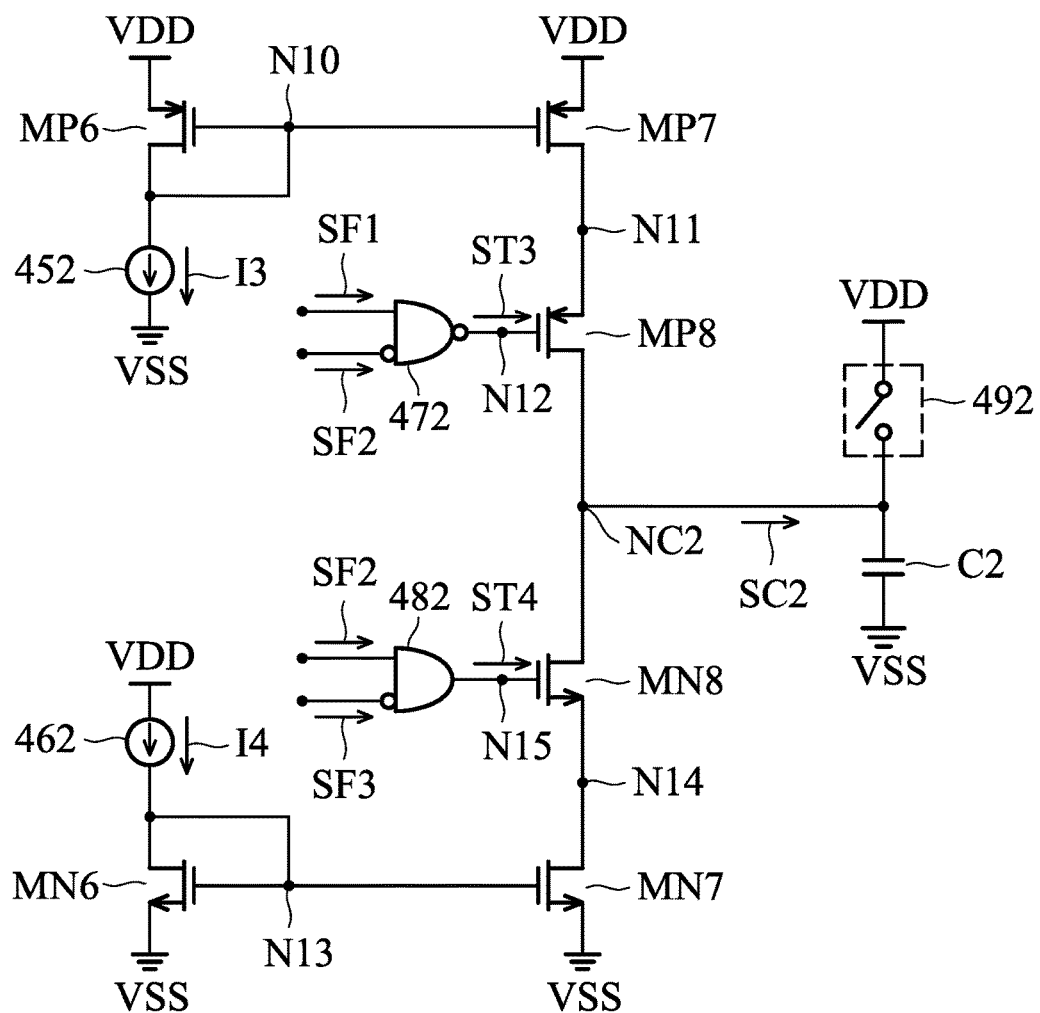
FIG. 4B is a diagram of a second control circuit according to an embodiment of the invention.

FIG. 4B is a diagram of the second control circuit 233 according to an embodiment of the invention. In the embodiment of FIG. 4B, the second control circuit 233 includes a sixth P-type transistor MP6, a seventh P-type transistor MP7, an eighth P-type transistor MP8, a second current sink 452, a second NAND gate 472, a sixth N-type transistor MN6, a seventh N-type transistor MN7, an eighth N-type transistor MN8, a second current source 462, a second AND gate 482, a second capacitor C2, and a second switch element 492. For example, each P-type transistor may be a PMOS transistor (P-type Metal Oxide Semiconductor Field Effect Transistor), and each N-type transistor may be an NMOS transistor (N-type Metal Oxide Semiconductor Field Effect Transistor). The sixth P-type transistor MP6 has a control terminal coupled to a tenth node N10, a first terminal coupled to the supply voltage VDD, and a second terminal coupled to the tenth node N10. The second current sink 452 draws a third current I3 from the tenth node N10. The seventh P-type transistor MP7 has a control terminal coupled to the tenth node N10, a first terminal coupled to the supply voltage VDD, and a second terminal coupled to an eleventh node N11. A third current mirror is formed by the sixth P-type transistor MP6 and the seventh P-type transistor MP7, which substantially have the same transistor sizes so as to mirror the third current I3 from the tenth node N10 to the eleventh node N11. The second NAND gate 472 has a first input terminal for receiving the first feedback signal SF1, a second input terminal for receiving the inverse of the second feedback signal SF2, and an output terminal for outputting a third tuning signal ST3 at a twelfth node N12. The eighth P-type transistor MP8 has a control terminal coupled to the twelfth node N12, a first terminal coupled to the eleventh node N11, and a second terminal coupled to a second control node NC2. The sixth N-type transistor MN6 has a control terminal coupled to a thirteenth node N13, a first terminal coupled to the ground voltage VSS, and a second terminal coupled to the thirteenth node N13. The second current source 462 supplies a fourth current I4 to the thirteenth node N13. The seventh N-type transistor MN7 has a control terminal coupled to the thirteenth node N13, a first terminal coupled to the ground voltage VSS, and a second terminal coupled to a fourteenth node N14. A fourth current mirror is formed by the sixth N-type transistor MN6 and the seventh N-type transistor MN7, which substantially have the same transistor sizes so as to mirror the fourth current I4 from the thirteenth node N13 to the fourteenth node N14. The second AND gate 482 has a first input terminal for receiving the second feedback signal SF2, a second input terminal for receiving the inverse of the third feedback signal SF3, and an output terminal for outputting a fourth tuning signal ST4 at a fifteenth node N15. The eighth N-type transistor MN8 has a control terminal coupled to the fifteenth node N15, a first terminal coupled to the fourteenth node N14, and a second terminal coupled to the second control node NC2. The second control node NC2 is arranged for outputting the second control signal SC2. If the second control circuit 233 is applied to the interpolator 200 of FIG. 2, the fourth current I4 may be substantially equal to the third current I3, the first feedback signal SF1 may be the first output signal SOUT1, the second feedback signal SF2 may be the output interpolation signal SIR, and the third feedback signal SF3 may be the second output signal SOUT2. The second capacitor C2 is coupled between the second control node NC2 and the ground voltage VSS. The second switch element 492 is coupled between the supply voltage VDD and the second control node NC2. The second switch element 492 is initially closed so as to charge the second capacitor C2 to the supply voltage VDD, and then it is opened and kept open so as to fine-tine the voltage level of the second control signal SC2. The first current I1 may be substantially equal to the third current I3.

Figure 5:
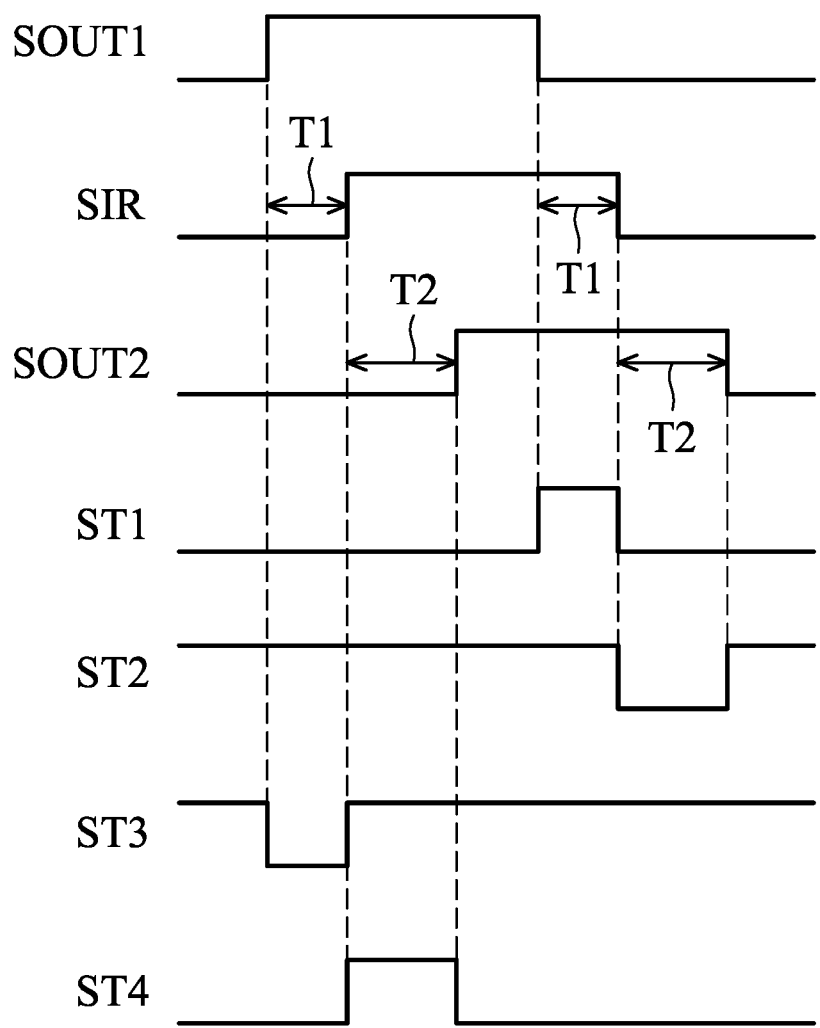
FIG. 5 is a diagram of signal waveforms of the interpolator according to an embodiment of the invention.
Figure 5:
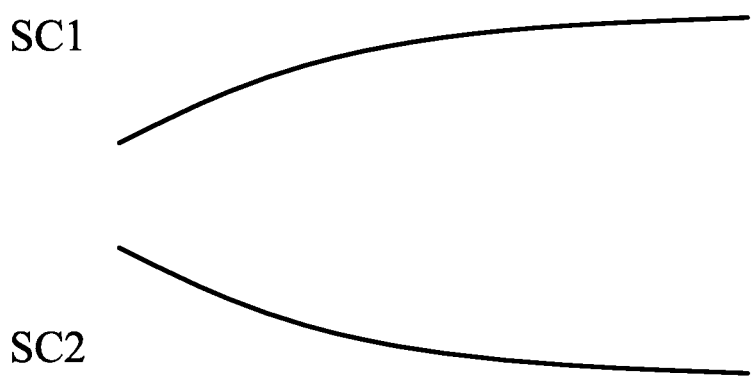

FIG. 5 is a diagram of signal waveforms of the interpolator 200 according to an embodiment of the invention. Note that the signal waveform of the second node N2 is, after being delayed by the fixed delay time of the fixed inverter 241, the inverse of the output interpolation signal SIR. The horizontal axis represents time, and the vertical axis represents voltage levels. As shown in FIG. 5, the time interval T1 is defined from the rising/falling edge of the first output signal SOUT1 to the rising/falling edge of the output interpolation signal SIR, and the time interval T2 is defined from the rising edge/falling of the output interpolation signal SIR to the rising edge/falling of the second output signal SOUT2. Initially, the voltage level of the first control signal SC1 is preset to the ground voltage VSS, and the voltage level of the second control signal SC2 is preset to the supply voltage VDD, such that the total delay time of tunable inverter 249 is minimized. Next, an evaluation process is performed to fine-tune the total delay time of tunable inverter 249. The first control signal SC1, which is generated according to the first tuning signal ST1 and the second tuning signal ST2, is used to fine-tune the falling edges of the output interpolation signal SIR (i.e., rising edges of the signal waveform of the second node N2). For example, if the time interval T2 is longer than the time interval T1, the low-logic pulse of the second tuning signal ST2 will be wider than the high-logic pulse of the first tuning signal ST1, such that the first capacitor C1 will be charged up from the ground voltage VSS. Accordingly, the voltage level of the first control signal SC1 will gradually become higher and reach a constant value, so that the signal waveform of the second node N2 will rise slower and the output interpolation signal SIR will fall slower (i.e., the time interval T1 increases and the time interval T2 decreases). Finally, the best delay time of the tunable inverter 249 will be determined, and the time intervals T1 and T2 will become equal to each other. Similarly, the second control signal SC2, which is generated according to the third tuning signal ST3 and the fourth tuning signal ST4, is used to fine-tune the rising edges of the output interpolation signal SIR (i.e., falling edges of the signal waveform of the second node N2). For example, if the time interval T2 is longer than the time interval T1, the high-logic pulse of the fourth tuning signal ST4 will be wider than the low-logic pulse of the third tuning signal ST3, such that the second capacitor C2 will be discharged down from the supply voltage VDD. Accordingly, the voltage level of the second control signal SC2 will gradually become lower and reach a constant value, so that the signal waveform of the second node N2 will fall slower and the output interpolation signal SIR will rise slower (i.e., the time interval T1 increases and the time interval T2 decreases). Finally, the best delay time of the tunable inverter 249 will be determined, and the time intervals T1 and T2 become equal to each other. In other words, the first control circuit 232 and the second control circuit 233 can optimize the total delay time of the tunable inverter 249, and therefore the tunable unit 231 of the tunable delay circuit 230 can provide the highly-accurate output interpolation signal SIR which has a phase exactly in the middle of the first output signal SOUT1 and the second output signal SOUT2. Since the proposed interpolator 200 is controlled automatically, it can be independent of PVT (Process, Voltage, and Temperature) variations.

Figure 6A:
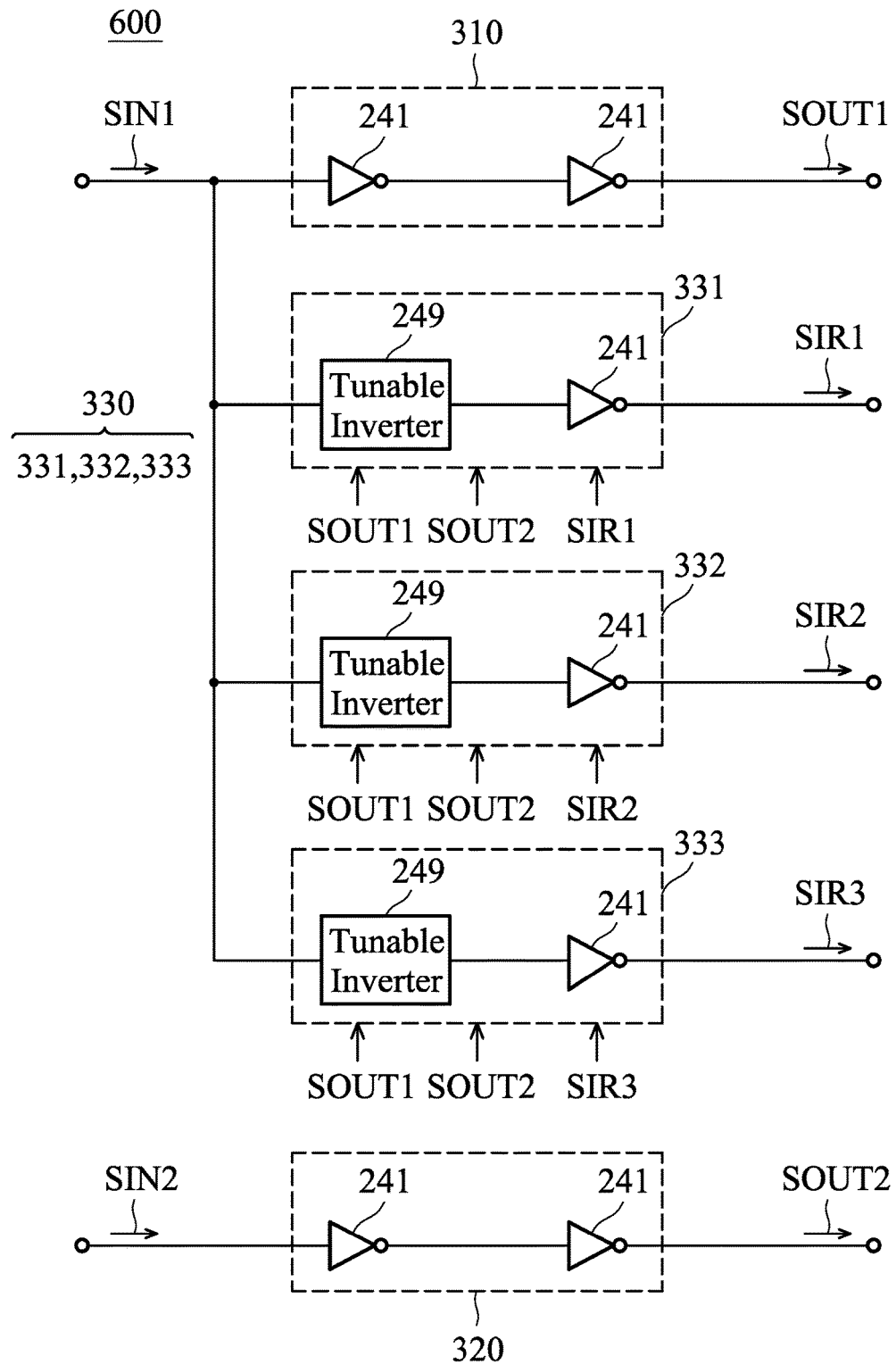
FIG. 6A is a diagram of an interpolator according to an embodiment of the invention.
Figure 6B:
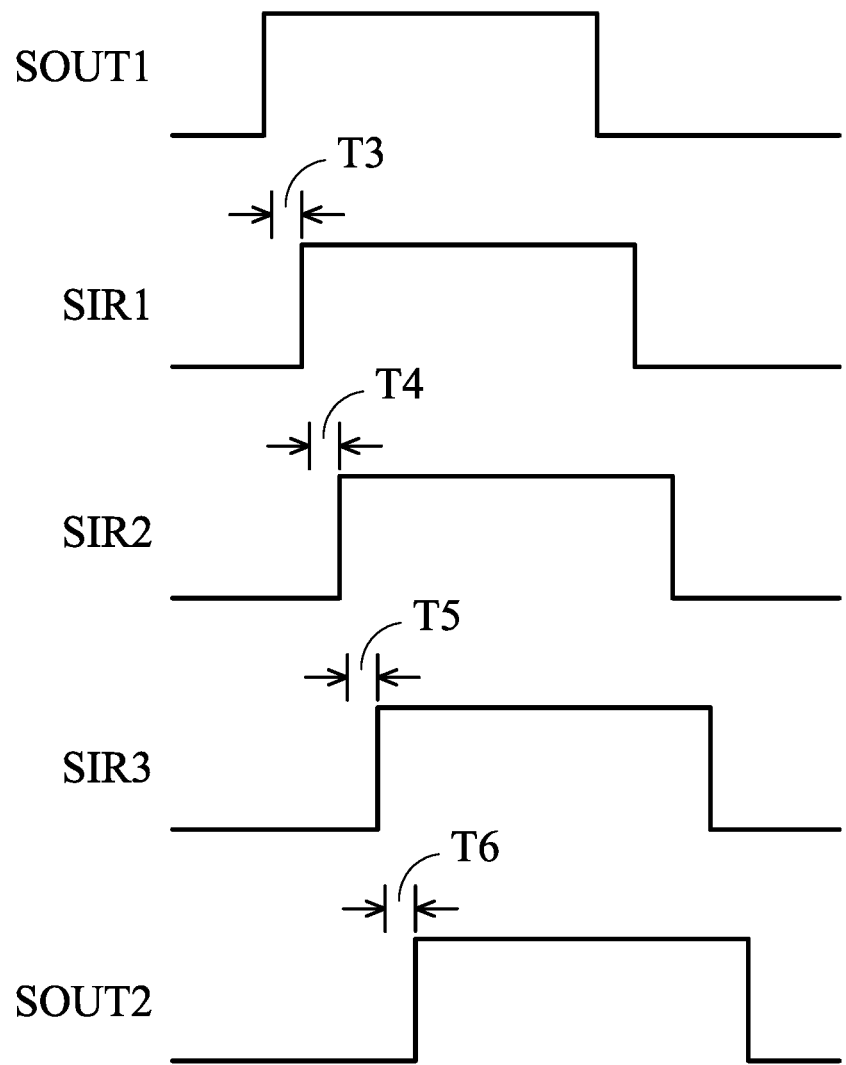
FIG. 6B is a diagram of signal waveforms of an interpolator according to an embodiment of the invention.

FIG. 6A is a diagram of an interpolator 600 according to an embodiment of the invention. FIG. 6A is similar to FIG. 2. In the embodiment of FIG. 6A, the interpolator 600 includes a first delay circuit 310, a second delay circuit 320, and a tunable delay circuit 330. The first delay circuit 310 delays a first input signal SIN1 for a fixed delay time, so as to generate a first output signal SOUT1. The second delay circuit 320 also delays a second input signal SIN2 for the fixed delay time, so as to generate a second output signal SOUT2. The tunable delay circuit 330 delays the first input signal SIN1 for different tunable delay times, so as to generate a first output interpolation signal SIR1, a second output interpolation signal SIR2, and a third output interpolation signal SIR3. FIG. 6B is a diagram of signal waveforms of the interpolator 600 according to an embodiment of the invention. As shown in FIG. 6B, the first output signal SOUT1 and the second output signal SOUT2 may have the same clock frequency, but the phase of the first output signal SOUT1 may lead the phase of the second output signal SOUT2. The phases of the first output interpolation signal SIR1, the second output interpolation signal SIR2, and the third output interpolation signal SIR3 may be all substantially between the phase of the first output signal SOUT1 and the phase of the second output signal SOUT2. For example, the time interval T3 between the rising edge of the first output signal SOUT1 and the rising edge of the first output interpolation signal SIR1, the time interval T4 between the rising edge of the first output interpolation signal SIR1 and the rising edge of the second output interpolation signal SIR2, the time interval T5 between the rising edge of the second output interpolation signal SIR2 and the rising edge of the third output interpolation signal SIR3, and the time interval T6 between the rising edge of the third output interpolation signal SIR3 and the rising edge of the second output signal SOUT2 may be substantially equal to each other. Each of the first delay circuit 310 and the second delay circuit 320 is formed by cascading two fixed inverters 241. The tunable delay circuit 330 includes a first tunable unit 331, a second tunable unit 332, and a third tunable unit 333. Each of the first tunable unit 331, the second tunable unit 332, and the third tunable unit 333 is formed by cascading a tunable inverter 249 and a fixed inverter 241. The tunable inverter 249 of the first tunable unit 331 has a tunable delay time, which is determined according to a negative feedback mechanism of the first output signal SOUT1, the second output signal SOUT2, and the first output interpolation signal SIR1. The tunable inverter 249 of the second tunable unit 332 has a tunable delay time, which is determined according to a negative feedback mechanism of the first output signal SOUT1, the second output signal SOUT2, and the second output interpolation signal SIR2. The tunable inverter 249 of the third tunable unit 333 has a tunable delay time, which is determined according to a negative feedback mechanism of the first output signal SOUT1, the second output signal SOUT2, and the third output interpolation signal SIR3. It should be noted that the invention is not limited to the above. In other embodiments, the interpolator 600 include fewer or more tunable units for generating fewer or more output interpolation signals although there are exactly three tunable units and three output interpolation signals displayed in FIG. 6A and FIG. 6B.

In comparison to the interpolator 200 of FIG. 2, the interpolator 600 including more than one tunable unit is slightly adjusted. Please refer to the following descriptions.

Each of the first tunable unit 331, the second tunable unit 332, and the third tunable unit 333 has an input node NIN and an output node NOUT, and its circuit structure is the same as the tunable unit 231 described in the embodiment of FIG. 3. The input node NOUT of each of the first tunable unit 331, the second tunable unit 332, and the third tunable unit 333 is arranged for receiving the first input signal SOUT1. The output node NOUT of the first tunable unit 331 is arranged for outputting the first output interpolation signal SIR1. The output node NOUT of the second tunable unit 332 is arranged for outputting the second output interpolation signal SIR2. The output node NOUT of the third tunable unit 333 is arranged for outputting the third output interpolation signal SIR3.

Each of the first tunable unit 331, the second tunable unit 332, and the third tunable unit 333 may further include a first control circuit for generate a first control signal, and its circuit structures may be the same as the first control circuit 232 described in the embodiment of FIG. 4A. For all of the first control circuits of the first tunable unit 331, the second tunable unit 332, and the third tunable unit 333, the first feedback signal SF1 is the first output signal SOUT1, and the third feedback signal SF3 is the second output signal SOUT2. However, the second feedback signal SF2 is different in three cases. For the first control circuit of the first tunable unit 331, the second feedback signal SF2 is the first output interpolation signal SIR1, and the first current I1 is substantially three times the second current I2. For the first control circuit of the second tunable unit 332, the second feedback signal SF2 is the second output interpolation signal SIR2, and the first current I1 is substantially equal to the second current I2. For the first control circuit of the third tunable unit 333, the second feedback signal SF2 is the third output interpolation signal SIR3, and the second current I2 is substantially three times the first current I1.

Each of the first tunable unit 331, the second tunable unit 332, and the third tunable unit 333 may further include a second control circuit for generating a second control signal, and its circuit structures may be the same as the second control circuit 233 described in the embodiment of FIG. 4B. For all of the second control circuits of the first tunable unit 331, the second tunable unit 332, and the third tunable unit 333, the first feedback signal SF1 is the first output signal SOUT1, and the third feedback signal SF3 is the second output signal SOUT2. However, the second feedback signal SF2 is different in three cases. For the second control circuit of the first tunable unit 331, the second feedback signal SF2 is the first output interpolation signal SIR1, and the third current I3 is substantially three times the fourth current I4. For the second control circuit of the second tunable unit 332, the second feedback signal SF2 is the second output interpolation signal SIR2, and the third current I3 is substantially equal to the fourth current I4. For the second control circuit of the third tunable unit 333, the second feedback signal SF2 is the third output interpolation signal SIR3, and the fourth current I4 is substantially three times the third current I3.

Other features of the interpolator 600 of FIG. 6A are similar to those of the interpolator 200 of FIG. 2, FIG. 3, FIG. 4A, and FIG. 4B. Accordingly, these embodiments can achieve similar levels of performance; that is to say, the successive phase differences between the first output signal SOUT1, the first output interpolation signal SIR1, the second output interpolation signal SIR2, the third output interpolation signal SIR3, and the second output signal SOUT2 are all substantially equal. If the interpolator 600 needs to provide fewer or more output interpolation signals, its tunable units, corresponding first control circuits, and corresponding second control circuits will be designed in a similar way as above. In general, to provide N output interpolation signals between the first output signal SOUT1 and the second output signal SOUT2 (e.g., N=1 in FIG. 2 and N=3 in FIG. 6A), the interpolator comprises N tunable units, with each corresponding tunable unit generating each of the N output interpolation signals. Each tunable unit is similar to those described in above, except that the second feedback signal SF2 of each tunable unit is its corresponding output interpolation signal, and that the current ratio of the first current I1 to the second current I2 (and the ratio of the third current I3 to the fourth current I4) for the nth tunable unit is (N+1−n)/n. The current ratios of the tunable units are designed to adjust the corresponding first control signal SC1 and second control signal SC2, so that the phase differences between the corresponding output interpolation signals are substantially equal.

The above embodiments describe the generation of the highly-accurate output interpolation signal SIR using analog circuits. Alternatively, the invention can be designed using digital circuits, and it can still provide similar levels of performance. Please refer to the following embodiments.

Figure 7:
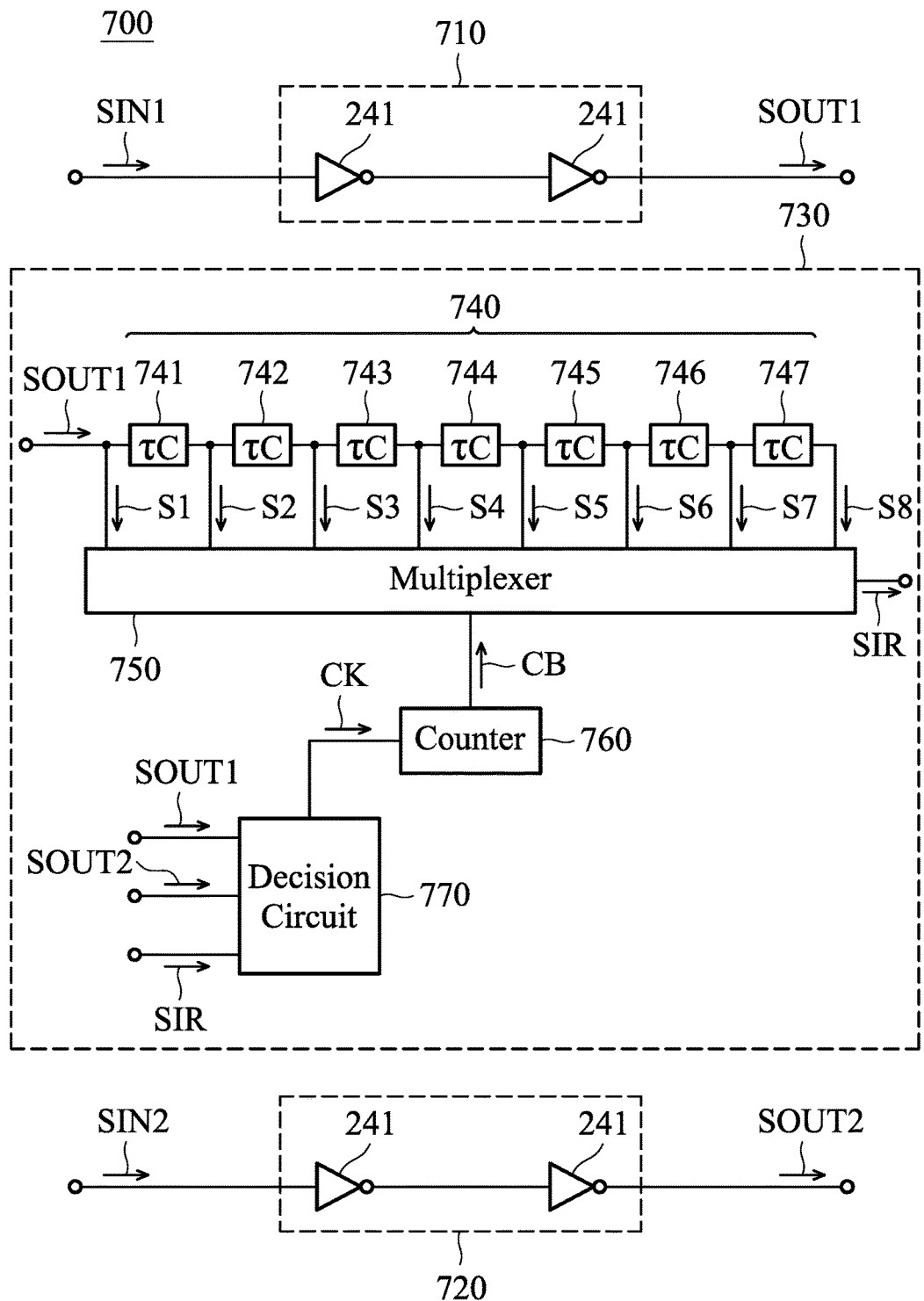
FIG. 7 is a diagram of an interpolator according to an embodiment of the invention.

FIG. 7 is a diagram of an interpolator 700 according to an embodiment of the invention. FIG. 7 is similar to FIG. 2. In the embodiment of FIG. 7, the interpolator 700 includes a first delay circuit 710, a second delay circuit 720, and a tunable delay circuit 730. The first delay circuit 710 delays a first input signal SIN1 for a fixed delay time, so as to generate a first output signal SOUT1. The second delay circuit 720 also delays a second input signal SIN2 for the fixed delay time, so as to generate a second output signal SOUT2. The tunable delay circuit 730 delays the first input signal SIN1 for a tunable delay time, so as to generate an output interpolation signal SIR. Each of the first delay circuit 710 and the second delay circuit 720 is formed by cascading two fixed inverters 241. The total delay time of the tunable delay circuit 730 is adjustable and determined according to a negative feedback mechanism of the first output signal SOUT1, the second output signal SOUT2, and the output interpolation signal SIR.

As shown in FIG. 7, the tunable delay circuit 730 is a digital control circuit which includes a delay chain 740, a multiplexer 750, a counter 760, and a decision circuit 770. The delay chain 740 delays the first output signal SOUT1 for different delay times, so as to generate a plurality of delay signals S1 to S8 which have different phases. For example, the delay chain 740 may include a plurality of delay units 741 to 747, whose combinations provide different lengths of delay times. Each of the delay units 741 to 747 may have a fixed delay time TC. The delay signal S1 may be delayed for zero delay time TC, the delay signal S2 may be delayed for one delay time TC, the delay signal S3 may be delayed for two delay times TC, and the delay signal S8 may be delayed for seven delay times TC. The multiplexer 750 selects one of the delay signals S1 to S8 as the output interpolation signal SIR according to a number CB from the counter 760. The number CB may include one or more binary bits, and each value of the number CB may correspond to a respective one of the delay signals S1 to S8. The counter 760 counts the number CB according to a control clock CK. For example, the counter 760 may initially set the number CB to a minimum value, and then gradually increase the number CB at every rising (or falling) edge of the control clock CK. The decision circuit 770 generates the control clock CK according to a negative feedback mechanism of the first output signal SOUT1, the second output signal SOUT2, and the output interpolation signal SIR, so as to find the best value of the number CB of the counter 760. The delay units 741 to 747 may be implemented by, for example, cascaded CMOS inverters; typical structures of the multiplexer 750 and the counter 760 are well known to those skilled in the art, and will not be described here.

In some embodiments, the delay chain 740 includes seven delay units 741 to 747, the number CB of the counter 760 includes three binary bits (e.g., the combination of the three binary bits is from "000" to "111"), and the multiplexer 750 selects one of the eight delay signals S1 to S8 as the output interpolation signal SIR according to the three binary bits. For example, the three binary bits "000", "001", . . . , and "111" may indicate the delay signals S1, S2, . . . , and S8, respectively. Initially, the number CB is preset to "000", which makes the multiplexer 750 select the delay signal S1 as the output interpolation signal SIR. The first delay signal S1 has a minimum delay time (e.g., zero delay time). Next, during the evaluation process, every time the counter 760 receives a rising edge of the control clock CK, the counter 760 increases the number CB by a binary one. Finally, the number CB reaches a constant value. For example, if the constant value of the number CB is "101", it will correspond to the delay signal S6, therefore the multiplexer 750 will select the delay signal S6 as the final output interpolation signal SIR. The phase of the output interpolation signal SIR may be substantially between the phase of the first output signal SOUT1 and the phase of the second output signal SOUT2. For example, the time interval between the rising edge of the first output signal SOUT1 and the rising edge of the output interpolation signal SIR may be substantially equal to the time interval between the rising edge of the output interpolation signal SIR and the rising edge of the second output signal SOUT2. It should be noted that the invention is not limited to the above. In other embodiments, the interpolator 700 include fewer or more delay units for generating fewer or more delay signals which are selected by the multiplexer 750 although there are exactly seven delay units and eight delay signals displayed in FIG. 7.

Figure 8:
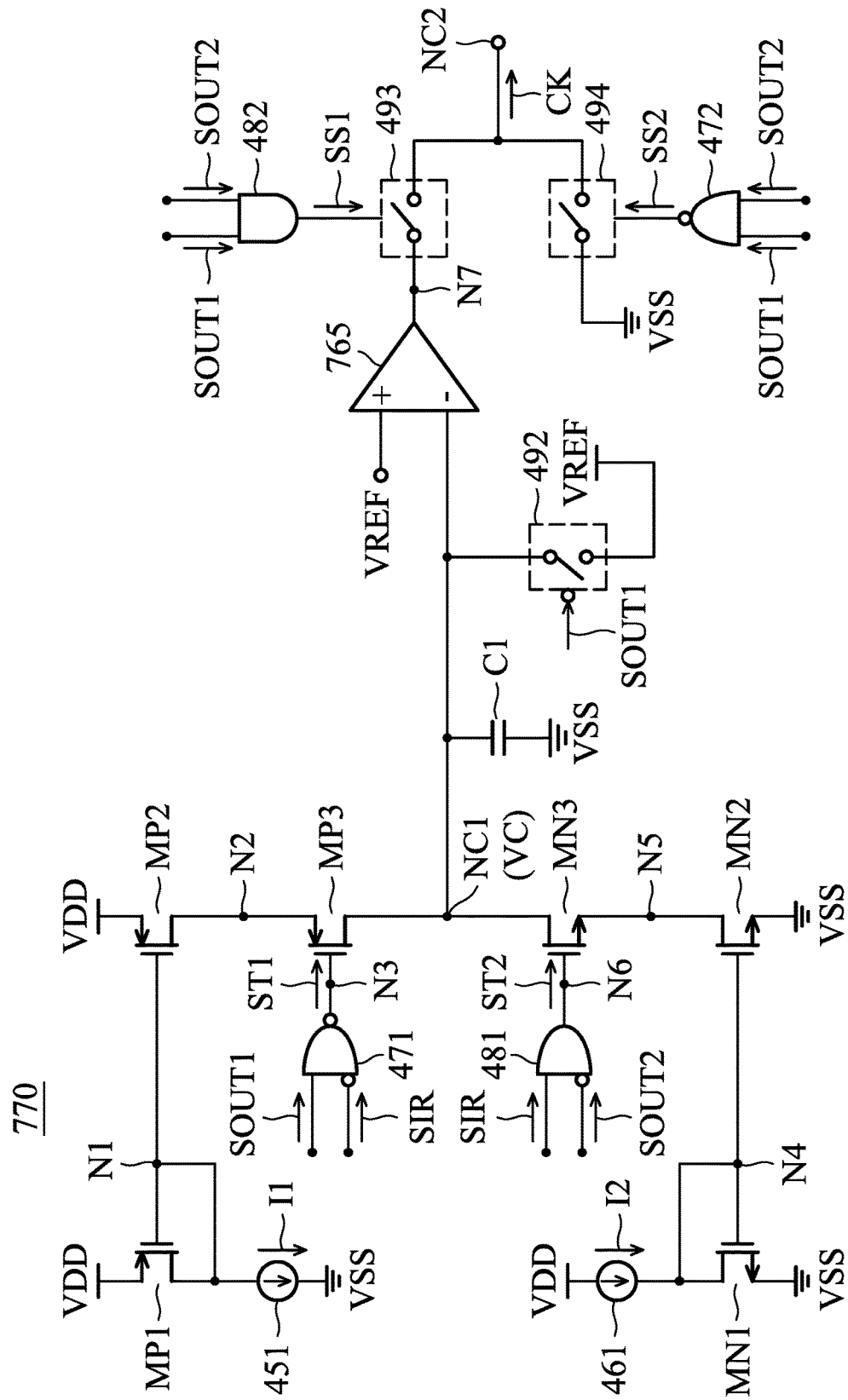
FIG. 8 is a diagram of a decision circuit according to an embodiment of the invention.

FIG. 8 is a diagram of the decision circuit 770 according to an embodiment of the invention. In the embodiment of FIG. 8, the decision circuit 770 includes a first P-type transistor MP1, a second P-type transistor MP2, a third P-type transistor MP3, a current sink 451, a first NAND gate 471, a first N-type transistor MN1, a second N-type transistor MN2, a third N-type transistor MN3, a current source 461, a first AND gate 481, a capacitor C1, a second switch element 492, a comparator 765, a second AND gate 482, a second NAND gate 472, a third switch element 493, and a fourth switch element 494. For example, each P-type transistor may be a PMOS transistor (P-type Metal Oxide Semiconductor Field Effect Transistor), and each N-type transistor may be an NMOS transistor (N-type Metal Oxide Semiconductor Field Effect Transistor).

The first P-type transistor MP1 has a control terminal coupled to a first node N1, a first terminal coupled to a supply voltage VDD, and a second terminal coupled to the first node N1. The current sink 451 draws a first current I1 from the first node N1. The second P-type transistor MP2 has a control terminal coupled to the first node N1, a first terminal coupled to the supply voltage VDD, and a second terminal coupled to a second node N2. A first current mirror is formed by the first P-type transistor MP1 and the second P-type transistor MP2, which substantially have the same transistor sizes so as to mirror the first current I1 from the first node N1 to the second node N2. The first NAND gate 471 has a first input terminal for receiving the first output signal SOUT1, a second input terminal for receiving the inverse of the output interpolation signal SIR, and an output terminal for outputting a first tuning signal ST1 at a third node N3. The third P-type transistor MP3 has a control terminal coupled to the third node N3, a first terminal coupled to the second node N2, and a second terminal coupled to a first control node NC1. The first N-type transistor MN1 has a control terminal coupled to a fourth node N4, a first terminal coupled to a ground voltage VSS, and a second terminal coupled to the fourth node N4. The current source 461 supplies a second current I2 to the fourth node N4. The second N-type transistor MN2 has a control terminal coupled to the fourth node N4, a first terminal coupled to the ground voltage VSS, and a second terminal coupled to a fifth node N5. A second current mirror is formed by the first N-type transistor MN1 and the second N-type transistor MN2, which substantially have the same transistor sizes so as to mirror the second current I2 from the fourth node N4 to the fifth node N5. The first AND gate 481 has a first input terminal for receiving the output interpolation signal SIR, a second input terminal for receiving the inverse of the second output signal SOUT2, and an output terminal for outputting a second tuning signal ST2 at a sixth node N6.

The third N-type transistor MN3 has a control terminal coupled to the sixth node N6, a first terminal coupled to the fifth node N5, and a second terminal coupled to the first control node NC1. The first current I1 may be substantially equal to the second current I2. The capacitor C1 is coupled between the first control node NC1 and the ground voltage VSS.

The second switch element 492 is coupled between the first control node NC1 and a reference voltage VREF. The second switch element 492 is selectively closed or opened according to the inverse of the first output signal SOUT1. For example, if the first output signal SOUT1 has a high logic level (i.e., a logic "1"), the second switch element 492 will be opened (i.e., not conducting), and if the first output signal SOUT1 has a low logic level (i.e., a logic "0"), the second switch element 492 will be closed (i.e., conducting). The reference voltage VREF is substantially a half of the supply voltage VDD (i.e., VDD/2). The second switch element 492 resets the control voltage VC to the reference voltage VREF every clock cycle. The comparator 765 has a positive input terminal coupled to the reference voltage VREF, a negative input terminal coupled to the first control node NC1, and an output terminal coupled to a seventh node N7. If the reference voltage VREF is higher than the control voltage VC, the comparator 765 will pull up the voltage at the seventh node N7 to the supply voltage VDD. Conversely, if the reference voltage VREF is lower than the control voltage VC, the comparator 765 will pull down the voltage at the seventh node N7 to the ground voltage VSS. The third switch element 493 is coupled between the seventh node N7 and a second control node NC2. The third switch element 493 is selectively closed or opened according to a first switching signal SS1. The second control node NC2 is arranged for outputting the control clock CK. The second AND gate 482 has a first input terminal for receiving the first output signal SOUT1, a second input terminal for receiving the second output signal SOUT2, and an output terminal for outputting the first switching signal SS1. For example, if the first switching signal SS1 has a high logic level, the third switch element 493 will be closed, and if the first switching signal SS1 has a low logic level, the third switch element 493 will be opened. The fourth switch element 494 is coupled between the ground voltage VSS and the second control node NC2. The fourth switch element 494 is selectively closed or opened according to a second switching signal SS2. The second NAND gate 472 has a first input terminal for receiving the first output signal SOUT1, a second input terminal for receiving the second output signal SOUT2, and an output terminal for outputting the second switching signal SS2. For example, if the second switching signal SS2 has a high logic level, the fourth switch element 494 will be closed, and if the second switching signal SS2 has a low logic level, the fourth switch element 494 will be opened. Since the first switching signal SS1 and the second switching signal SS2 are complementary, the second control node NC2 is coupled to either the seventh node N7 or the ground voltage VSS, it results in the high-logic intervals and the low-logic intervals of the control clock CK.

Figure 9:
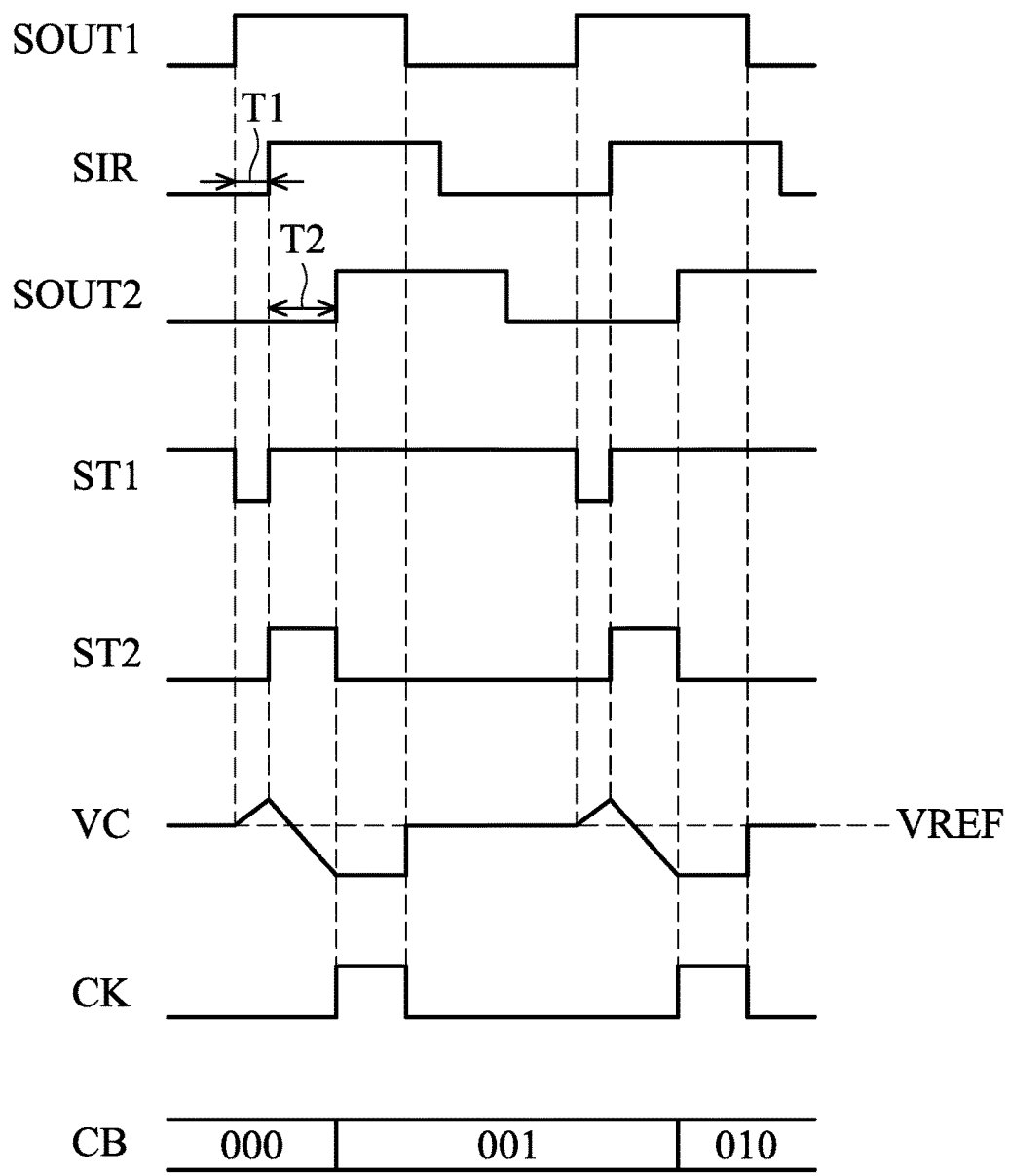
FIG. 9 is a diagram of signal waveforms of an interpolator according to an embodiment of the invention.

FIG. 9 is a diagram of signal waveforms of the interpolator 700 according to an embodiment of the invention. The horizontal axis represents time, and the vertical axis represents voltage levels. As shown in FIG. 9, the time interval T1 is defined from the rising edge of the first output signal SOUT1 to the rising edge of the output interpolation signal SIR, and the time interval T2 is defined from the rising edge of the output interpolation signal SIR to the rising edge of the second output signal SOUT2. Initially, the number CB of the counter 760 is preset to the smallest binary bits "000", which corresponds to the shortest delay time of the delay chain 740. Next, the decision circuit 770 generates the control clock CK by comparing the output interpolation signal SIR with the first output signal SOUT1 and the second output signal SOUT2. For example, if the time interval T2 is longer than the time interval T1, the high-logic pulse of the second tuning signal ST2 will be wider than the low-logic pulse of the first tuning signal ST1, such that the control voltage VC will be discharged down from the reference voltage VREF. Accordingly, the voltage level of the control voltage VC will gradually become lower and reach a constant value at the falling edge of the second tuning signal ST2. The comparator 765 compares the reference voltage VREF with the control voltage VC, so as to selectively induce the high-logic intervals of the control clock CK when the first switching signal SS1 has a high logic level. The counter 760 gradually increases the number CB at every rising edge of the control clock CK. The control voltage VC may be reset to the reference VREF every clock cycle. Finally, the number CB reaches a constant value, and the time intervals T1 and T2 become equal to each other. In other words, the tunable delay circuit 730 (digital control circuit) can optimize the total delay time of the delay chain 740, and therefore the multiplexer 750 can select the best delay signal as the output interpolation signal SIR. Since the proposed interpolator 700 is controlled automatically, it can be independent of PVT (Process, Voltage, and Temperature) variations. In other embodiments, multiple output interpolation signals between the first output signal SOUT1 and the second output signal SOUT2 may be generated by using multiple tunable delay circuits 730 similar to the analog circuit example in above, where each tunable delay circuit 730 uses its corresponding output interpolation signal in its first NAND gate 471 and first AND gate 481, and the current ratio of the first current I1 to the second current I2 is similarly designed as in above.

The invention provides a novel interpolator with highly-accurate characteristics. In conclusion, the proposed design has at least the following advantages over the prior art: (1) being capable of automatically fine-tuning the output interpolation signal with a negative feedback mechanism, (2) being implemented with analog circuits or digital circuits, and (3) being more linear and insensitive to the variations of PVT (Process, Voltage, and Temperature) variations.

Note that the above voltages, currents, resistances, inductances, capacitances and other element parameters are not limitations of the invention. A designer can adjust these parameters according to different requirements. The interpolator of the invention is not limited to the configurations of FIGS. 1-9. The invention may merely include any one or more features of any one or more embodiments of FIGS. 1-13. In other words, not all of the features displayed in the figures should be implemented in the interpolator of the invention. Although the embodiments of the invention use MOSFETs as examples, the invention is not limited thereto, and those skilled in the art may use other types of transistors such as BJT (Bipolar Junction Transistors), JFET (Junction Gate Field Effect Transistor), FinFET (Fin Field Effect Transistor), etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. An interpolator, comprising:
a first delay circuit, delaying a first input signal for a fixed delay time, so as to generate a first output signal;
a second delay circuit, delaying a second input signal for the fixed delay time, so as to generate a second output signal; and
a tunable delay circuit, delaying the first input signal for a tunable delay time, so as to generate an output interpolation signal, wherein the tunable delay time is determined according to the first output signal, the second output signal, and the output interpolation signal,
wherein the first output signal, the second output signal, and the output interpolation signal have the same frequency, and a phase of the first output signal leads a phase of the second output signal, and a phase of the output interpolation signal is between the phase of the first output signal and the phase of the second output signal;
wherein the tunable delay circuit comprises a tunable unit which is formed by cascading a tunable inverter and a fixed inverter, wherein the tunable inverter is controlled by the first output signal, the second output signal, and the output interpolation signal.

2. The interpolator as claimed in claim 1, wherein the phase of the output interpolation signal is substantially in the middle of the phase of the first output signal and the phase of the second output signal.

3. The interpolator as claimed in claim 1, wherein each of the first delay circuit and the second delay circuit is formed by cascading two fixed inverters.

4. The interpolator as claimed in claim 1, wherein the tunable unit has an input node and an output node, and comprises:
a first P-type transistor, wherein the first P-type transistor has a control terminal, a first terminal coupled to a supply voltage, and a second terminal coupled to a first node;
a second P-type transistor, wherein the second P-type transistor has a control terminal, a first terminal coupled to the first node, and a second terminal coupled to a second node;
a first N-type transistor, wherein the first N-type transistor has a control terminal, a first terminal coupled to a third node, and a second terminal coupled to the second node;
a second N-type transistor, wherein the second N-type transistor has a control terminal, a first terminal coupled to a ground voltage, and a second terminal coupled to the third node; and
an inverter, wherein the inverter has an input terminal coupled to the second node, and an output terminal coupled to the output node;
wherein the control terminal of one of the first P-type transistor and the second P-type transistor is coupled to the input node, and the control terminal of the other one of the first P-type transistor and the second P-type transistor is coupled to a first control signal,
wherein the control terminal of one of the first N-type transistor and the second N-type transistor is coupled to the input node, and the control terminal of the other one of the first N-type transistor and the second N-type transistor is coupled to a second control signal,
wherein the first control signal and the second control signal are generated according to the first output signal, the second output signal, and the output interpolation signal,
wherein the input node of the tunable unit is arranged for receiving the first input signal, and the output node of the tunable unit is arranged for outputting the output interpolation signal.

5. The interpolator as claimed in claim 4, wherein the tunable unit further comprises a first control circuit which comprises:
a third P-type transistor, wherein the third P-type transistor has a control terminal coupled to a fourth node, a first terminal coupled to the supply voltage, and a second terminal coupled to the fourth node;
a first current sink, drawing a first current from the fourth node;
a fourth P-type transistor, wherein the fourth P-type transistor has a control terminal coupled to the fourth node, a first terminal coupled to the supply voltage, and a second terminal coupled to a fifth node;
a first NAND gate, wherein the first NAND gate has a first input terminal for receiving an inverse of a second feedback signal, a second input terminal for receiving a third feedback signal, and an output terminal for outputting a second tuning signal at a sixth node;
a fifth P-type transistor, wherein the fifth P-type transistor has a control terminal coupled to the sixth node, a first terminal coupled to the fifth node, and a second terminal coupled to a first control node;
a third N-type transistor, wherein the third N-type transistor has a control terminal coupled to a seventh node, a first terminal coupled to the ground voltage, and a second terminal coupled to the seventh node;
a first current source, supplying a second current to the seventh node;
a fourth N-type transistor, wherein the fourth N-type transistor has a control terminal coupled to the seventh node, a first terminal coupled to the ground voltage, and a second terminal coupled to an eighth node;
a first AND gate, wherein the first AND gate has a first input terminal for receiving an inverse of a first feedback signal, a second input terminal for receiving the second feedback signal, and an output terminal for outputting a first tuning signal at a ninth node; and
a fifth N-type transistor, wherein the fifth N-type transistor has a control terminal coupled to the ninth node, a first terminal coupled to the eighth node, and a second terminal coupled to the first control node;
wherein the first control node is arranged for outputting the first control signal, the first feedback signal is the first output signal, the second feedback signal is the output interpolation signal, and the third feedback signal is the second output signal.

6. The interpolator as claimed in claim 5, wherein the first control circuit further comprises:
a first capacitor, coupled between the first control node and the ground voltage; and
a first switch element, coupled between the first control node and the ground voltage, wherein the first switch element is initially closed and then kept open so as to fine-tine a voltage level of the first control signal.

7. The interpolator as claimed in claim 4, wherein the tunable unit further comprises a second control circuit which comprises:
- a sixth P-type transistor, wherein the sixth P-type transistor has a control terminal coupled to a tenth node, a first terminal coupled to the supply voltage, and a second terminal coupled to the tenth node;
- a second current sink, drawing a third current from the tenth node;
- a seventh P-type transistor, wherein the seventh P-type transistor has a control terminal coupled to the tenth node, a first terminal coupled to the supply voltage, and a second terminal coupled to an eleventh node;
- a second NAND gate, wherein the second NAND gate has a first input terminal for receiving a first feedback signal, a second input terminal for receiving an inverse of a second feedback signal, and an output terminal for outputting a third tuning signal at a twelfth node;
- an eighth P-type transistor, wherein the eighth P-type transistor has a control terminal coupled to the twelfth node, a first terminal coupled to the eleventh node, and a second terminal coupled to a second control node;
- a sixth N-type transistor, wherein the sixth N-type transistor has a control terminal coupled to a thirteenth node, a first terminal coupled to the ground voltage, and a second terminal coupled to the thirteenth node;
- a second current source, supplying a fourth current to the thirteenth node;
- a seventh N-type transistor, wherein the seventh N-type transistor has a control terminal coupled to the thirteenth node, a first terminal coupled to the ground voltage, and a second terminal coupled to a fourteenth node;
- a second AND gate, wherein the second AND gate has a first input terminal for receiving the second feedback signal, a second input terminal for receiving an inverse of a third feedback signal, and an output terminal for outputting a fourth tuning signal at a fifteenth node; and
- an eighth N-type transistor, wherein the eighth N-type transistor has a control terminal coupled to the fifteenth node, a first terminal coupled to the fourteenth node, and a second terminal coupled to the second control node;
- wherein the second control node is arranged for outputting the second control signal, the first feedback signal is the first output signal, the second feedback signal is the output interpolation signal, and the third feedback signal is the second output signal.

8. The interpolator as claimed in claim 7, wherein the second control circuit further comprises:
- a second capacitor, coupled between the second control node and the ground voltage; and
- a second switch element, coupled between the supply voltage and the second control node, wherein the second switch element is initially closed and then kept open so as to fine-tine a voltage level of the second control signal.

9. The interpolator as claimed in claim 1, wherein the tunable delay circuit further generates a plurality of output interpolation signals that have the same frequency and have different corresponding phases that are between the phase of the first output signal and the phase of the second output signal, wherein the tunable delay circuit comprises a plurality of tunable units, each of which is formed by cascading a tunable inverter and a fixed inverter, and each of which generates a corresponding one of the plurality of output interpolation signals according to the first output signal, the second output signal, and the corresponding one of the plurality of output interpolation signals.

10. The interpolator as claimed in claim 9, wherein each of the plurality of tunable units has an input node and an output node, and comprises:
- a first P-type transistor, wherein the first P-type transistor has a control terminal, a first terminal coupled to a supply voltage, and a second terminal coupled to a first node;
- a second P-type transistor, wherein the second P-type transistor has a control terminal, a first terminal coupled to the first node, and a second terminal coupled to a second node;
- a first N-type transistor, wherein the first N-type transistor has a control terminal, a first terminal coupled to a third node, and a second terminal coupled to the second node;
- a second N-type transistor, wherein the second N-type transistor has a control terminal, a first terminal coupled to a ground voltage, and a second terminal coupled to the third node; and
- an inverter, wherein the inverter has an input terminal coupled to the second node, and an output terminal coupled to the output node;
- wherein the control terminal of one of the first P-type transistor and the second P-type transistor is coupled to the input node, and the control terminal of the other one of the first P-type transistor and the second P-type transistor is coupled to a first control signal,
- wherein the control terminal of one of the first N-type transistor and the second N-type transistor is coupled to the input node, and the control terminal of the other one of the first N-type transistor and the second N-type transistor is coupled to a second control signal,
- wherein the input node of each of the plurality of tunable units is arranged for receiving the first input signal;
- wherein the output node of each of the plurality of tunable units is arranged for outputting the corresponding one of the plurality of output interpolation signals;
- wherein for each of the plurality of tunable units, the first control signal and the second control signal are generated according to the first output signal, the second output signal, and the corresponding one of the plurality of output interpolation signals.

11. The interpolator as claimed in claim 10, wherein each of the plurality of tunable units further comprises a first control circuit which comprises:
- a third P-type transistor, wherein the third P-type transistor has a control terminal coupled to a fourth node, a first terminal coupled to the supply voltage, and a second terminal coupled to the fourth node;
- a first current sink, drawing a first current from the fourth node;
- a fourth P-type transistor, wherein the fourth P-type transistor has a control terminal coupled to the fourth node, a first terminal coupled to the supply voltage, and a second terminal coupled to a fifth node;
- a first NAND gate, wherein the first NAND gate has a first input terminal for receiving an inverse of a second feedback signal, a second input terminal for receiving a third feedback signal, and an output terminal for outputting a second tuning signal at a sixth node;
- a fifth P-type transistor, wherein the fifth P-type transistor has a control terminal coupled to the sixth node, a first terminal coupled to the fifth node, and a second terminal coupled to a first control node, and wherein the first control node is arranged for outputting the first control signal;

a third N-type transistor, wherein the third N-type transistor has a control terminal coupled to a seventh node, a first terminal coupled to the ground voltage, and a second terminal coupled to the seventh node;

a first current source, supplying a second current to the seventh node;

a fourth N-type transistor, wherein the fourth N-type transistor has a control terminal coupled to the seventh node, a first terminal coupled to the ground voltage, and a second terminal coupled to an eighth node;

a first AND gate, wherein the first AND gate has a first input terminal for receiving an inverse of a first feedback signal, a second input terminal for receiving the second feedback signal, and an output terminal for outputting a first tuning signal at a ninth node;

a fifth N-type transistor, wherein the fifth N-type transistor has a control terminal coupled to the ninth node, a first terminal coupled to the eighth node, and a second terminal coupled to the first control node;

a first capacitor, coupled between the first control node and the ground voltage; and a first switch element, coupled between the first control node and the ground voltage, wherein the first switch element is initially closed and then kept open so as to fine-tine a voltage level of the first control signal;

wherein the first feedback signal is the first output signal, the second feedback signal is the corresponding one of the plurality of output interpolation signals, and the third feedback signal is the second output signal.

12. The interpolator as claimed in claim 11, wherein for each of the plurality of tunable units, the current ratio of the first current to the second current for the nth tunable unit is $(N+1-n)/n$, wherein N is the total number of the plurality of tunable units.

13. The interpolator as claimed in claim 10, wherein each of the plurality of tunable units further comprises a second control circuit which comprises:

a sixth P-type transistor, wherein the sixth P-type transistor has a control terminal coupled to a tenth node, a first terminal coupled to the supply voltage, and a second terminal coupled to the tenth node;

a second current sink, drawing a third current from the tenth node;

a seventh P-type transistor, wherein the seventh P-type transistor has a control terminal coupled to the tenth node, a first terminal coupled to the supply voltage, and a second terminal coupled to an eleventh node;

a second NAND gate, wherein the second NAND gate has a first input terminal for receiving a first feedback signal, a second input terminal for receiving an inverse of a second feedback signal, and an output terminal for outputting a third tuning signal at a twelfth node;

an eighth P-type transistor, wherein the eighth P-type transistor has a control terminal coupled to the twelfth node, a first terminal coupled to the eleventh node, and a second terminal coupled to a second control node, and wherein the second control node is arranged for outputting the second control signal;

a sixth N-type transistor, wherein the sixth N-type transistor has a control terminal coupled to a thirteenth node, a first terminal coupled to the ground voltage, and a second terminal coupled to the thirteenth node;

a second current source, supplying a fourth current to the thirteenth node;

a seventh N-type transistor, wherein the seventh N-type transistor has a control terminal coupled to the thirteenth node, a first terminal coupled to the ground voltage, and a second terminal coupled to a fourteenth node;

a second AND gate, wherein the second AND gate has a first input terminal for receiving the second feedback signal, a second input terminal for receiving an inverse of a third feedback signal, and an output terminal for outputting a fourth tuning signal at a fifteenth node;

an eighth N-type transistor, wherein the eighth N-type transistor has a control terminal coupled to the fifteenth node, a first terminal coupled to the fourteenth node, and a second terminal coupled to the second control node;

a second capacitor, coupled between the second control node and the ground voltage; and a second switch element, coupled between the supply voltage and the second control node, wherein the second switch element is initially closed and then kept open so as to fine-tine a voltage level of the second control signal;

wherein the first feedback signal is the first output signal, the second feedback signal is the corresponding one of the plurality of output interpolation signals, and the third feedback signal is the second output signal.

14. The interpolator as claimed in claim 13, wherein for each of the plurality of tunable units, the current ratio of the third current to the fourth current for the nth tunable unit is $(N+1-n)/n$, wherein N is the total number of the plurality of tunable units.

* * * * *